(12) United States Patent
Migita et al.

(10) Patent No.: US 8,745,475 B2
(45) Date of Patent: Jun. 3, 2014

(54) SEMICONDUCTOR APPARATUS AND INFORMATION PROCESSING APPARATUS

(75) Inventors: Koji Migita, Kawasaki (JP); Kazumasa Kubotera, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 66 days.

(21) Appl. No.: 13/422,046

(22) Filed: Mar. 16, 2012

(65) Prior Publication Data

US 2012/0290903 A1 Nov. 15, 2012

(30) Foreign Application Priority Data

Mar. 23, 2011 (JP) ................................. 2011-064863

(51) Int. Cl.
*H04L 1/00* (2006.01)

(52) U.S. Cl.
USPC .......................................... 714/799; 714/755

(58) Field of Classification Search
USPC .................. 714/775, 789, 799, 752; 327/156; 375/327

See application file for complete search history.

(56) References Cited

U.S. PATENT DOCUMENTS

| | | | | |
|---|---|---|---|---|
| 5,363,411 A | * | 11/1994 | Furuya et al. ................. | 375/316 |
| 6,486,716 B1 | * | 11/2002 | Minami et al. ................ | 327/152 |
| 6,792,063 B1 | * | 9/2004 | Ogura ........................... | 375/375 |
| 7,856,074 B2 | * | 12/2010 | Kuwata ......................... | 375/371 |
| 8,373,478 B2 | * | 2/2013 | Ku ................................. | 327/158 |
| 8,432,957 B2 | * | 4/2013 | Kim .............................. | 375/226 |
| 2005/0008111 A1 | * | 1/2005 | Suzuki .......................... | 375/371 |
| 2009/0140787 A1 | * | 6/2009 | Shiratsuchi et al. .......... | 327/254 |

FOREIGN PATENT DOCUMENTS

| | | |
|---|---|---|
| JP | 2-206070 A | 8/1990 |
| JP | 2001-75671 A | 3/2001 |
| JP | 2005-33392 A | 2/2005 |

* cited by examiner

*Primary Examiner* — Esaw Abraham
*Assistant Examiner* — Osman Alshack
(74) *Attorney, Agent, or Firm* — Westerman, Hattori, Daniels & Adrian, LLP

(57) ABSTRACT

A semiconductor apparatus includes a delay circuit to apply delay to an input signal, a phase detector to detect a phase of an output signal which is outputted from the delay circuit, a filter to set a range of the phase of the output signal for stable operation based on phase information outputted from the phase detector, a counter to count a number of detections of the output signal when the phase deviates from the range for stable operation, a discount controller to generate a discount signal indicating a discount number for the number counted by the counter, in accordance with an operating condition or an external factor outside the delay circuit and an error detector to determine whether or not an error of the phase of the output signal has occurred based on the number counted by the counter and a discount number indicated by the discount signal.

7 Claims, 20 Drawing Sheets

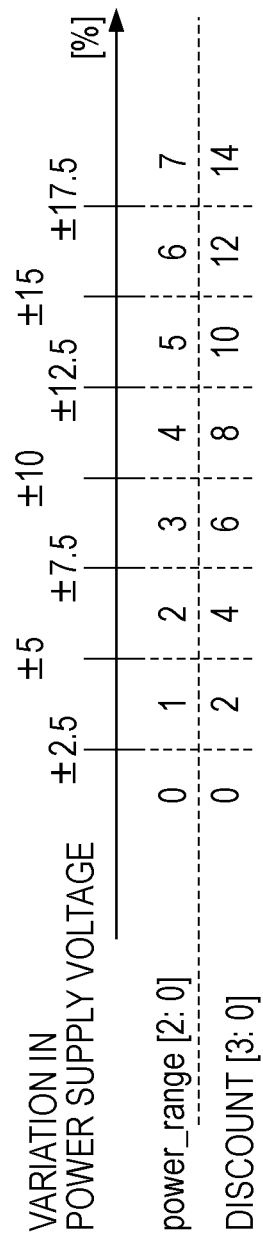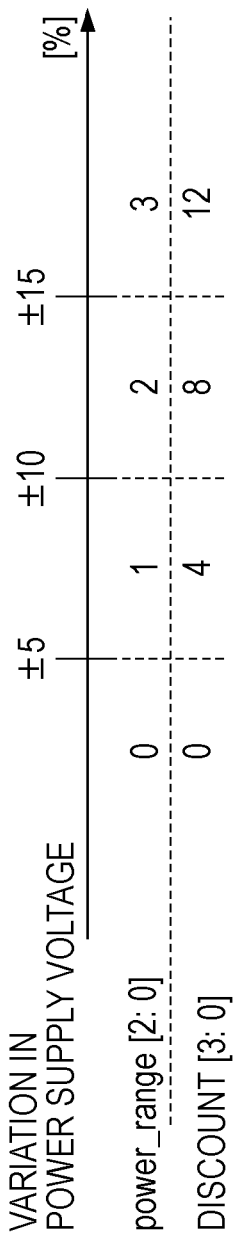

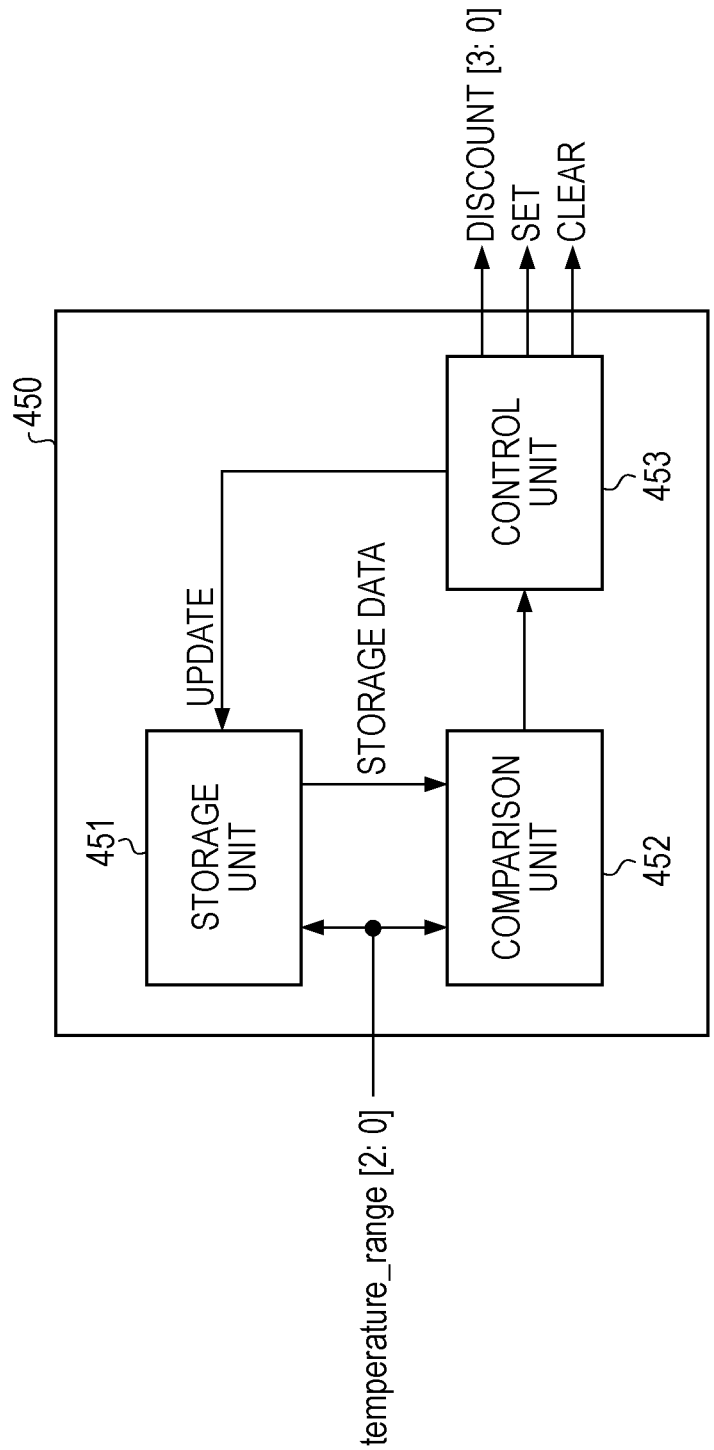

SEMICONDUCTOR APPARATUS AND INFORMATION PROCESSING APPARATUS

CROSS-REFERENCE TO RELATED APPLICATION

This application is based upon and claims the benefit of priority of the prior Japanese Patent Application No. 2011-64863, filed on Mar. 23, 2011, the entire contents of which are incorporated herein by reference.

FIELD

The embodiments discussed herein are related to a semiconductor apparatus and an information processing apparatus.

BACKGROUND

Conventionally, there has been provided a semiconductor circuit apparatus which compensates the output phase of a variable delay circuit for more than a delay time variable range of the variable delay circuit in such a manner that when the output phase of the variable delay circuit selected as a route of a clock signal differs from the output phase of another variable delay circuit by only one cycle, the semiconductor circuit apparatus switches the operation from the variable delay circuit to another variable delay circuit.

In addition, there has been provided a semiconductor circuit apparatus which avoids excessive tracking of the jitter included in input data by making a majority decision using a majority circuit on the results of phase comparison made by phase comparators.

In addition, there has been provided a synchronization detection circuit which counts the number of continuous errors when synchronization errors occur continuously, and determines that the initially detected synchronizing signal has been erroneously detected when the number of the continuous errors reaches a predetermined number.

The following are reference documents:
[Document 1] Japanese Laid-Open Patent Publication No. 2001-075671,
[Document 2] Japanese Laid-Open Patent Publication No. 2005-033392, and
[Document 3] Japanese Laid-Open Patent Publication No. 2-206070 are examples of related art.

SUMMARY

According to an aspect of the invention, an semiconductor apparatus includes a delay circuit to apply delay to an input signal, a phase detector to detect a phase of an output signal which is outputted from the delay circuit, a filter to set a range of the phase of the output signal for stable operation based on phase information outputted from the phase detector, a counter to count a number of detections of the output signal when the phase deviates from the range for stable operation, a discount controller to generate a discount signal indicating a discount number for the number counted by the counter, in accordance with an operating condition or an external factor outside the delay circuit, and an error detector to determine whether or not an error of the phase of the output signal has occurred based on the number counted by the counter and a discount number indicated by the discount signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 13A and 13B are tables each illustrating a correspondence between the value of an input signal and the value of an output signal of the discount control unit of the signal delay circuit in Embodiment 2;

FIG. 18 is a diagram illustrating a discount control unit connected to the signal delay circuit included in the semiconductor apparatus in Embodiment 4;

DESCRIPTION OF EMBODIMENTS

Hereinafter, an embodiment, to which a semiconductor apparatus and an information processing apparatus of the present disclosure are applied, is described.

Before describing a semiconductor apparatus and an information processing apparatus in each of Embodiments 1 to 4, a signal delay circuit included in a semiconductor apparatus of a comparative example is first described with reference to FIGS. 1 to 3.

Figure 1:
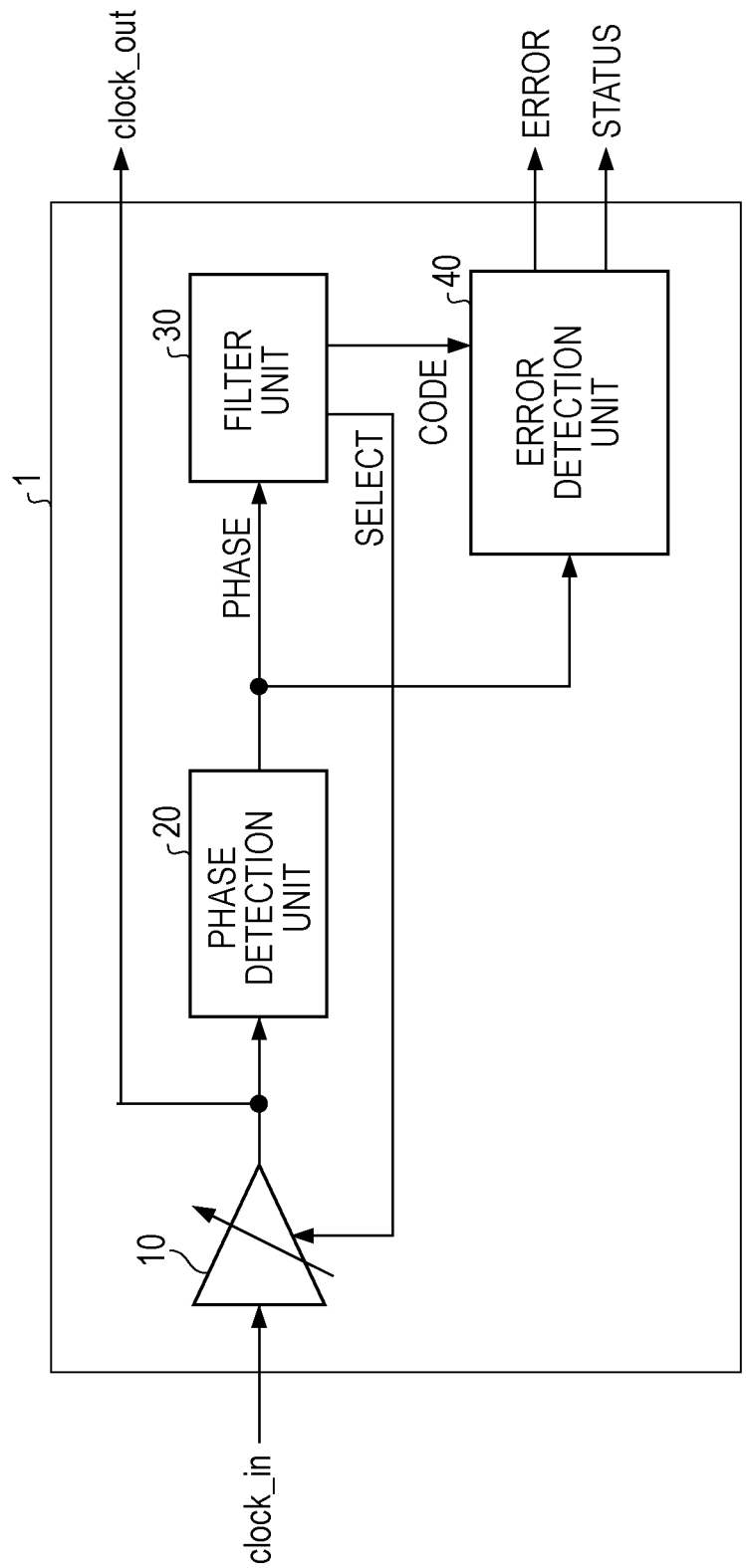
FIG. 1 is a block diagram illustrating a signal delay circuit of a comparative example.

FIG. 1 is a block diagram illustrating a signal delay circuit 1 of the comparative example.

The signal delay circuit 1 of the comparative example is achieved by, for example, an LSI (Large Scale Integrated circuit).

The signal delay circuit 1 includes a delay unit 10, a phase detection unit 20, a filter unit 30, and an error detection unit 40.

The delay unit 10 outputs a clock (clock_out) which is an input clock (clock_in) with a delay added thereto. A delay time added to an input clock by the delay unit 10 is variably set based on a selection signal (select) inputted from the filter unit 30. An output clock from the delay unit 10 is outputted as an output (clock_out) of the signal delay circuit 1, while being inputted to the phase detection unit 20.

The phase detection unit 20 detects the phase of a clock outputted from the delay unit 10, and outputs a phase signal (phase) indicating the phase of the clock to the filter unit 30 and the error detection unit 40. The phase detection unit 20 detects, for example, the phase of the clock on the rising edge of each cycle.

The filter unit 30 holds a target value of the phases of the clocks that are outputted from the delay unit 10, and represents an example of a setting unit to set a range of the phase, for stable operation, of the clock outputted from the delay unit 10. The range of phase for stable operation, which is set by the filter unit 30 is a range having a predetermined width and a center value which is approximately equal to the target value of the phases of the clocks outputted from the delay unit 10.

The filter unit 30 removes those clocks that have a phase out of the range of phase for stable operation by a filtering process, the phase being indicated by a phase signal (phase) inputted from the phase detection unit 20 for each cycle of the clock. In addition, the filter unit 30 feeds back a selection signal (select) for adjusting the delay amount in the delay unit 10 to the delay unit 10 in accordance with the differences between the phases of the clocks in the range of phase for stable operation and the target value. Additionally, the filter unit 30 outputs a code indicating a range of phase for stable operation to the error detection unit 40.

The error detection unit 40 sets an acceptable range corresponding to the range of phase for stable operation based on the code signal (code) indicating the range of phase for stable operation outputted from the filter unit 30, while determining whether or not the phase of each clock outputted from the delay unit 10 is within the acceptable range as well as counting the number of events that the phase is out of the acceptable range.

The error detection unit 40 sets the acceptable range that has the same range as the range of phase for stable operation set by the filter unit 30. That is to say, the acceptable range set by the error detection unit 40 indicates the range of phase (lock range) for stable operation in the delay unit 10. Therefore, the error detection unit 40 may determine whether or not the phase of each clock detected by the phase detection unit 20 is out of the range of phase for stable operation, which is set by the filter unit 30.

The error detection unit 40 outputs a status signal (status) that includes, for example, the codes indicating the upper and lower limits of the acceptable range, and a code (phase) indicating the phase of a clock. In addition, the error detection unit 40, when determining that the phase of a clock detected by the phase detection unit 20 is out of the acceptable range, outputs an error signal (error) indicating that an error has occurred. The status signal (status) and the error signal (error) are transmitted to a supervisory channel of the system including the signal delay circuit 1. The error signal (error) may also include the number of times (count number counted by the error detection unit 40) when the phase is out of the acceptable range.

As described above, the signal delay circuit 1 of the comparative example adds a delay to an input signal (clock), thereby outputting an output signal (clock) that has a phase according to the targeted value.

Figure 2:
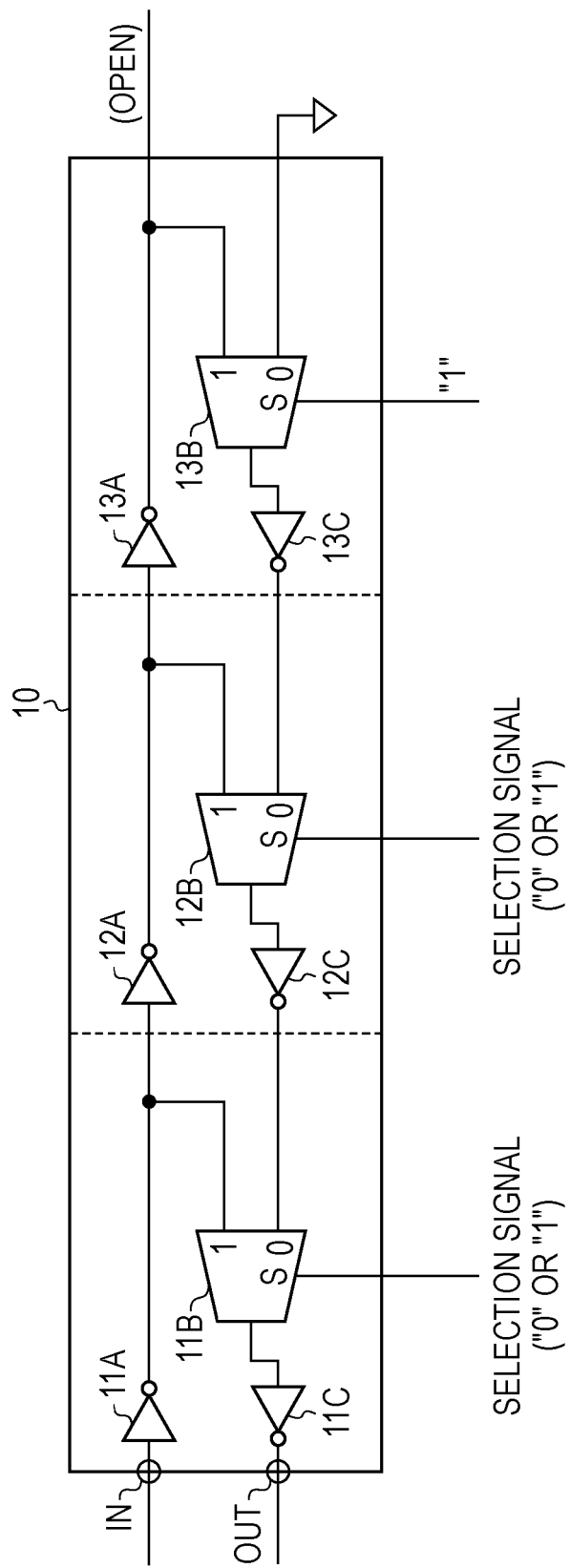
FIG. 2 is a diagram illustrating a delay unit included in the signal delay circuit of the comparative example.

FIG. 2 is a diagram illustrating the delay unit 10 included in the signal delay circuit 1 of the comparative example.

The delay unit 10 includes inverters 11A, 12A, 13A, selectors 11B, 12B, 13B, and inverters 11C, 12C, 13C.

The inverters 11A to 13A are inverters on the forward side configured to transmit respective signals to the selectors 11B to 13B through which the signals are returned; while the inverters 11C to 13C are inverters on the return side configured to transmit the respective signals returned by the selectors 11B to 13B.

The inverters 11A to 13A are negative circuits configured to invert respective input signals and output the inverted signals.

The inverters 11A to 13A are an example of a delay element that is connected in series by connecting relevant output and input terminals of the inverters 11A to 13A. The input terminal of the inverter 11A is connected to an input terminal IN of the delay unit 10, while the output terminal of the inverter 13A is open and connected to one input terminal of the selector 13B.

The selectors 11B to 13B are provided corresponding to the respective inverters 11A to 13A. The selectors 11B to 13B each have two input terminals and a selection signal input terminal S, and represent an example of a selection unit configured to select one of the inputs in accordance with a selection signal inputted to the selection signal input terminal S.

Here, a selection signal of "1" or "0" is inputted to the selection signal input terminal S of the selectors 11B, 12B from the filter unit 30. A selection signal which is clipped to a signal level of "1" is inputted to the selection signal input terminal S of the selector 13B. A predetermined voltage indicating a signal level "1" of a selection signal may be generated, for example, by converting the power supply voltage with a resistor or the like, and is inputted to the selection signal input terminal S of the selector 13B.

Accordingly, the selectors 11B, 12B each select one of the inputs in accordance with a selection signal ("1" or "0") inputted from the filter unit 30, while the selector 13B typically selects and outputs the output of the inverter 13A.

The inverters 11C to 13C are negative circuits configured to invert respective input signals and output the inverted signals, and are provided corresponding to the respective selectors 11B to 13B. The inverters 11C to 13C are alternately connected to the selectors 11B to 13B in series, and are configured to invert respective outputs of the selectors 11B to 13B and to output the inverted outputs. The inverters 11C to 13C are an example of a delay element.

The output terminal of the inverter 13A is connected to one input terminal of the selector 13B. The other input terminal of the selector 13B is grounded, and "0" is inputted as fixed data to the other input terminal.

The output terminal of the inverter 12A is connected to one input terminal of the selector 12B, and the output terminal of the inverter 13C is connected to the other input terminal of the selector 12B.

The output terminal of the inverter 11A is connected to one input terminal of the selector 11B, and the output terminal of the inverter 12C is connected to the other input terminal of the selector 11B.

The output terminal of the selector 11B is connected to the input terminal of the inverter 11C, and the output terminal of the inverter 11C is connected to an output terminal OUT of the delay unit 10.

The delay unit 10 adjusts the delay amount for the signal inputted to the input terminal IN by selecting one of the selectors 11B to 12B, through which the input signal is returned, and thus outputs a delayed signal from the output terminal OUT.

As described above, a selection signal which is clipped to a signal level of "1" is inputted to the selection signal input terminal S of the selector 13B which is located furthest from the input terminal IN of the delay unit 10, and thus the selector 13B typically selects the output of the inverter 13A.

When the selection signals inputted to the selectors 11B and 12B are "0" and "0", respectively, in the semiconductor apparatus of the comparative example, the selectors 11B and 12B select the outputs of the inverters 12C and 13C, respectively, and thus the signal is returned through the selector 13B in the delay unit 10.

When the selection signals inputted to the selectors 11B and 12B are "0" and "1", respectively, the selector 11B selects the output of the inverter 12C, the selector 12B selects the output of the inverter 12A, and thus the signal is returned through the selector 12B.

In this case, the selector 13B selects the output of the inverter 13A and inputs the output to the inverter 13C, however, the output of the inverter 13C is not selected by the selector 12B, and thus the signal is not returned through the selector 13B.

When the selection signals inputted to the selectors 11B and 12B are "1" and "0", respectively, the selector 11B selects the output of the inverter 11A, and thus the signal is returned through the selector 11B.

In this case, the selector 13B selects the output of the inverter 13A and inputs the output to the inverter 13C, and the output of the inverter 13C is selected by the selector 12B, however, the output of the inverter 12C is not selected by the selector 11B, and thus the signal is not returned through the selector 13B.

So far, the delay unit 10 has been described, as an example, which includes three stages of the inverters 11A, 12A, 13A, the selectors 11B, 12B, 13B, and the inverters 11C, 12C, 13C. However, the number of stages of the inverters on the forward and return sides, and of the selectors may be determined in accordance with the delay amount to be added to each clock.

For example, in the case where a clock output signal with a phase of 180° is outputted, a delay amount may be set stepwise with 257 stages of the inverters on the forward and return sides, and of the selectors by using, for example, an 8-bit selection signal.

In this case, an 8-bit selection signal outputted by the filter unit 30 may be converted to a 256-bit selection signal, which may be inputted to one of 256 selectors out of 257 stages of the selectors, excluding the selector that is located furthest from the input terminal IN and the output terminal OUT of the delay unit 10. In this case, a selection signal with a fixed value may be inputted to the selector that is located furthest from the input terminal IN and the output terminal OUT of the delay unit 10 so that the selector typically returns an incoming signal.

In FIG. 2, the delay unit 10 is illustrated, as an example, that has a configuration in which a signal transmitted through some inverters on the forward side is returned by a selector, and is outputted through the relevant inverters on the return side. However, the circuit configuration of the delay unit 10 is not limited to the above configuration. The delay unit 10 may have another circuit configuration as long as the delay unit 10 is capable of adding a delay to an input signal to output a delayed signal, and the architecture employed does not matter.

Figure 3A:
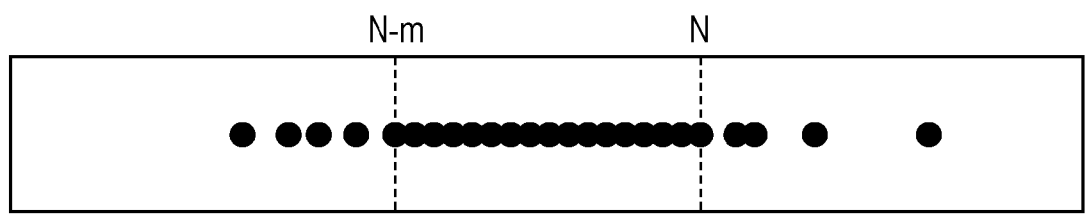
FIG. 3A is a diagram schematically illustrating the relationship between clock phases and a range of phase for stable operation, the clock phases each being indicated by a phase signal (phase) inputted to a filter unit of the signal delay circuit of the comparative example.
Figure 3B:
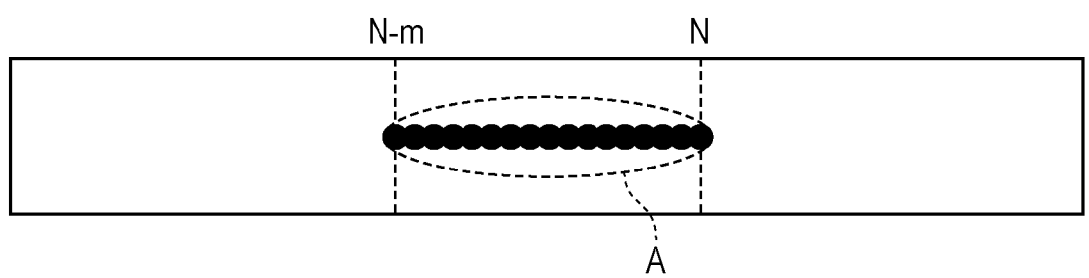
FIG. 3B is a diagram schematically illustrating the relationship between clock phases and the range of phase for stable operation after the clock phases undergo a filtering process by the filter unit.
Figure 3C:
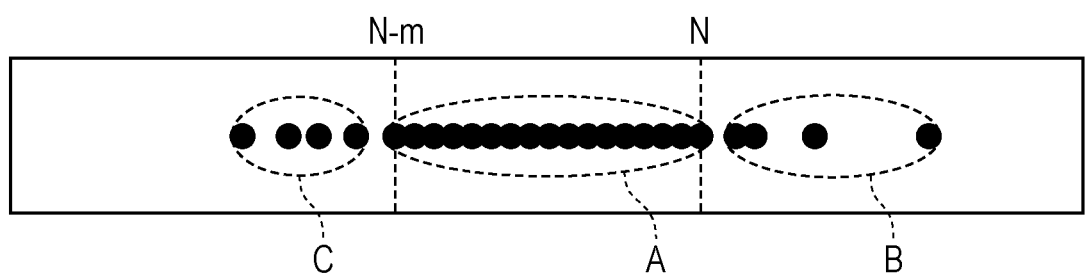
FIG. 3C is a diagram schematically illustrating the relationship between an acceptable range in an error detection unit and the clock phases.

Next, the clock phase detected by the phase detection unit 20, the range of phase for stable operation set by the filter unit 30, and the acceptable range set by the detection unit 40 are described with reference to FIGS. 3A to 3C. In FIGS. 3A to 3C, the clock phase is represented by a point.

FIG. 3A is a diagram schematically illustrating the relationship between clock phases and a range of phase for stable operation, the clock phases each being indicated by a phase signal (phase) inputted to a filter unit 30 of the signal delay circuit 1 of the comparative example. Each point illustrated in FIG. 3A represents a clock phase before undergoing a filtering process by the filter unit 30, and the clock phase is detected by the phase detection unit 20.

FIG. 3B is a diagram schematically illustrating the relationship between clock phases and the range of phase for stable operation after the clock phases undergo the filtering process by the filter unit 30.

FIG. 3C is a diagram schematically illustrating the relationship between an acceptable range in an error detection unit 40 and the clock phases.

Here, the upper limit and the width of the range of phase for stable operation and the acceptable range are assumed to be N and m, respectively. The target value of the clock phase, which is held by the filter unit 30 is assumed to be expressed by N−(m/2).

The upper limit N and the width m of a first acceptable range are determined by the filter unit 30 in such a manner that the signal delay circuit 100 properly operate based on the distribution of the clock phases indicated by the phase signals (phase) inputted to the filter unit 30. The filter unit 30 may determine the upper limit N and the width m of the first acceptable range using a target value.

As illustrated in FIG. 3A, most of the clock phases detected by the phase detection unit 20 fall within the range of phase for stable operation (N−m to N) with the target value at the center of the range.

Deviation of the phase of a clock from the range of phase for stable operation (N−m to N) may be caused by, for example, a malfunction of the delay unit 10, an abnormal condition of the clock, or the like, but, in addition, may be caused by, for example, a fluctuation of the temperature or the power supply voltage of the delay unit 10.

Thus, deviation of the phase of a clock from the range of phase for stable operation (N−m to N) may be caused by a factor (external factor) which occurs outside the signal delay circuit 1, or outside a semiconductor apparatus including the signal delay circuit.

Because a clock phase deviated from the range of phase for stable operation (N−m to N) is removed by the filtering process of the filter unit 30, every clock phase after undergoing the filtering process falls within the range of phase for stable operation (N−m to N) as indicated by a dashed ellipse A in FIG. 3B.

Because the error detection unit 40 has the same acceptable range (N−m to N) as that of the filter unit 30, when phase signals (phase) indicating clock phases are inputted from the phase detection unit 20 as illustrated in FIG. 3C, the error detection unit 40 determines that a clock phase is normal if the clock phase falls within the acceptable range (N−m to N), or determines that an abnormal condition has occurred if the clock phase deviates from the acceptable range (N−m to N).

That is to say, the error detection unit 40 determines that the clock phases indicated by the dashed ellipse A in FIG. 3C are normal because the clock phases fall within the acceptable range (N−m to N), and determines that the clock phases indicated by dashed ellipses B, C are abnormal.

In the case where the error detection unit 40 determines that an abnormal condition has occurred, an error signal is transmitted to the supervisory channel including the signal delay circuit 1, and then the operation of the system including the signal delay circuit 1 is stopped, for example.

In the case where the phase of the clock inputted to the signal delay circuit 1 varies due to an operating condition or an external factor such as a fluctuation of the power supply voltage or the temperature of the signal delay circuit 1, the operation of the system including the signal delay circuit 1 may not be affected even if the error detection unit 40 does not make an error determination.

For example, in the case where the frequency of error occurrence due to an operating condition or an external factor is very low (e.g., less than 1%), or data is monitored outside the signal delay circuit 1, the operation of the system including the signal delay circuit 1 may not be affected even if the error detection unit 40 does not make an error determination.

Here, the data monitoring performed outside the signal delay circuit 1 may be achieved by transfer of data accompanied by an ECC (Error Checking and Correction) code or an enable signal on a bus, on which the data transfer is synchronized with the clock (clock_in).

A variation in the clock phase due to an operating condition or an external factor causes deviation of the clock phase from the acceptable range of the error detection unit 40, for example, with a probability of less than several percent, and thus the deviation is caused several to several tens times out of 10,000 detections of clock phase, which is very small compared with the entire clock phases.

Consequently, when the variation in the clock phase due to an operating condition or an external factor is relatively small, the entire system may be smoothly and stably operated by rather continuing the operation of the system including the signal delay circuit 1 without making an error determination by the error detection unit 40.

As described above, the semiconductor apparatus including the signal delay circuit 1 of the comparative example makes an error determination unconditionally whenever a clock phase deviates from the acceptable range because of an operating condition or an external factor, then stops an information processing apparatus such as a server including the signal delay circuit 1, and thus achieving smooth and stable operation of the entire system may be difficult in some cases.

Thus, it is an object of the below-described Embodiments 1 to 4 to provide a semiconductor apparatus and an information processing apparatus that solve the above-mentioned problem. Hereinafter, semiconductor apparatuses and information processing apparatuses in Embodiments 1 to 4 are described.

[Embodiment 1]

Hereinafter, in the description of the semiconductor apparatus and the information processing apparatus in Embodiment 1, the components identical or equivalent to those of the semiconductor apparatus of the comparative example are labeled with the same reference symbols, and description thereof is omitted.

Figure 4:
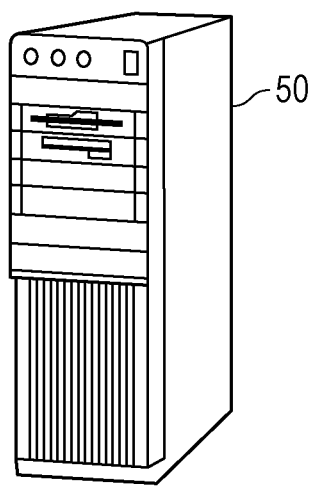
FIG. 4 is an illustration of a server including a semiconductor apparatus in Embodiment 1.

FIG. 4 is an illustration of a server 50 including the semiconductor apparatus in Embodiment 1.

The server 50 illustrated in FIG. 4 is an example of an information processing apparatus including the semiconductor apparatus in Embodiment 1. The server 50 includes, for example, a CPU (Central Processing Unit), and a main storage.

Figure 5:
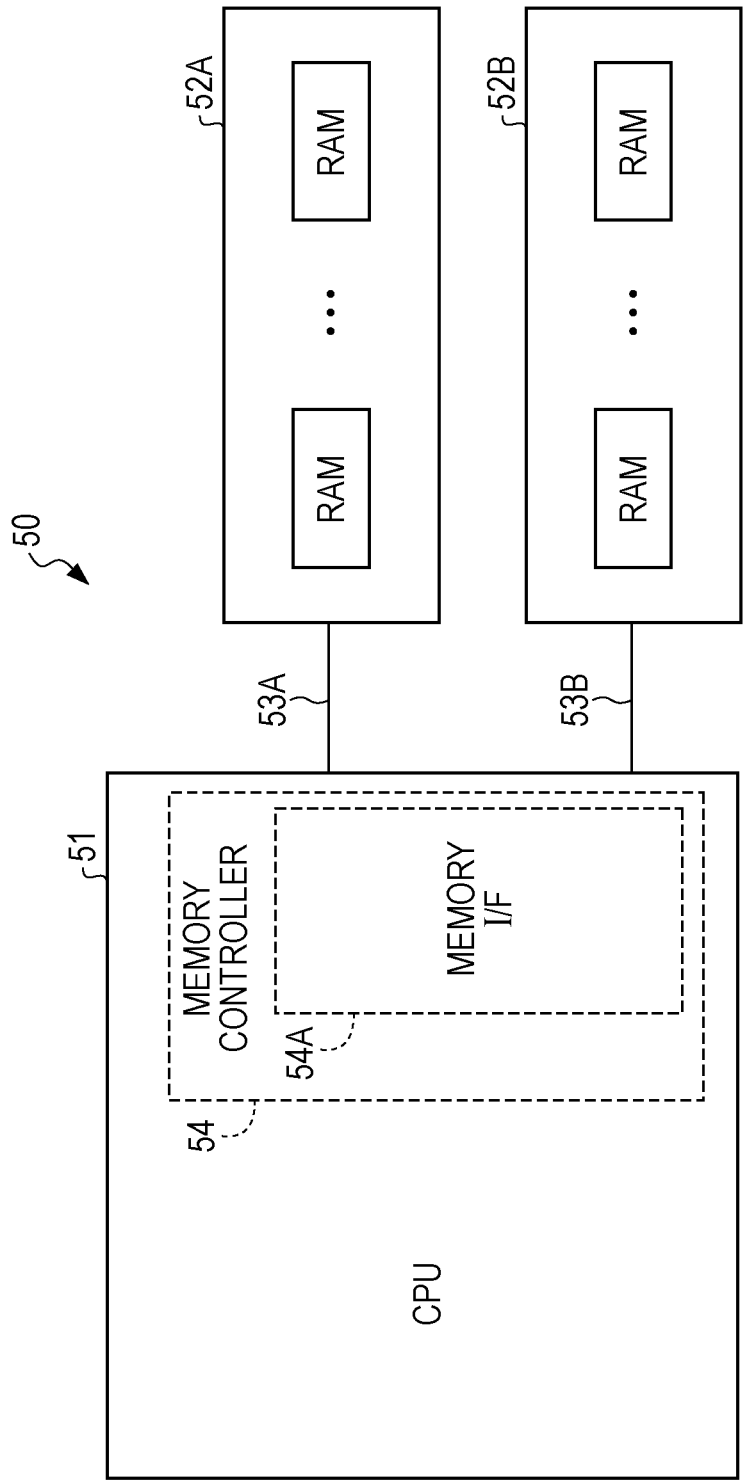
FIG. 5 is a block diagram illustrating the server including the semiconductor apparatus in Embodiment 1.

FIG. 5 is a block diagram illustrating the server 50 including the semiconductor apparatus in Embodiment 1.

The server 50 includes a CPU 51 and main storage units 52A, 52B. The CPU 51 and the main storage units 52A and 52B are connected by buses 53A and 53B, respectively.

The CPU 51 includes a memory controller 54, and acquires data from or transfers data between the main storage units 52A and 52B via a memory I/F (Interface) 54A in the memory controller 54, while processing the acquired data.

The main storage units 52A, 52B include, for example, a plurality of modularized RAMs (Random Access Memories). Although two main storage units 52A, 52B are illustrated in FIG. 5, three or more main storage units may be provided.

The memory controller 54 performs data transfer between the CPU 51 and the main storage units 52A, 52B. The memory controller 54 has the memory I/F 54A in order to achieve data communication across the boundary between the main storage units 52A and 52B.

The semiconductor apparatus in Embodiment 1 is, for example, the memory controller 54 which has a signal delay circuit in the memory I/F 54A. FIG. 5 illustrates an embodiment, in which the CPU 51 includes the memory controller 54, however, the memory controller 54 may be provided outside the CPU 51. Alternatively, the semiconductor apparatus in Embodiment 1 may be a chipset including the memory controller 54.

Here, the signal delay circuit included in the semiconductor apparatus in Embodiment 1 is an example of a signal delay circuit configured to output an output signal which is an input clock with a delay added thereto. The signal delay circuit included in the semiconductor apparatus in Embodiment 1 is used as, for example, a system clock when data transfer is performed between the main storage units 52A and 52B by the memory controller 54 as the semiconductor apparatus in Embodiment 1.

Next, a signal delay circuit 100 included in the semiconductor apparatus in Embodiment 1 is described with reference to FIG. 6.

Figure 6:
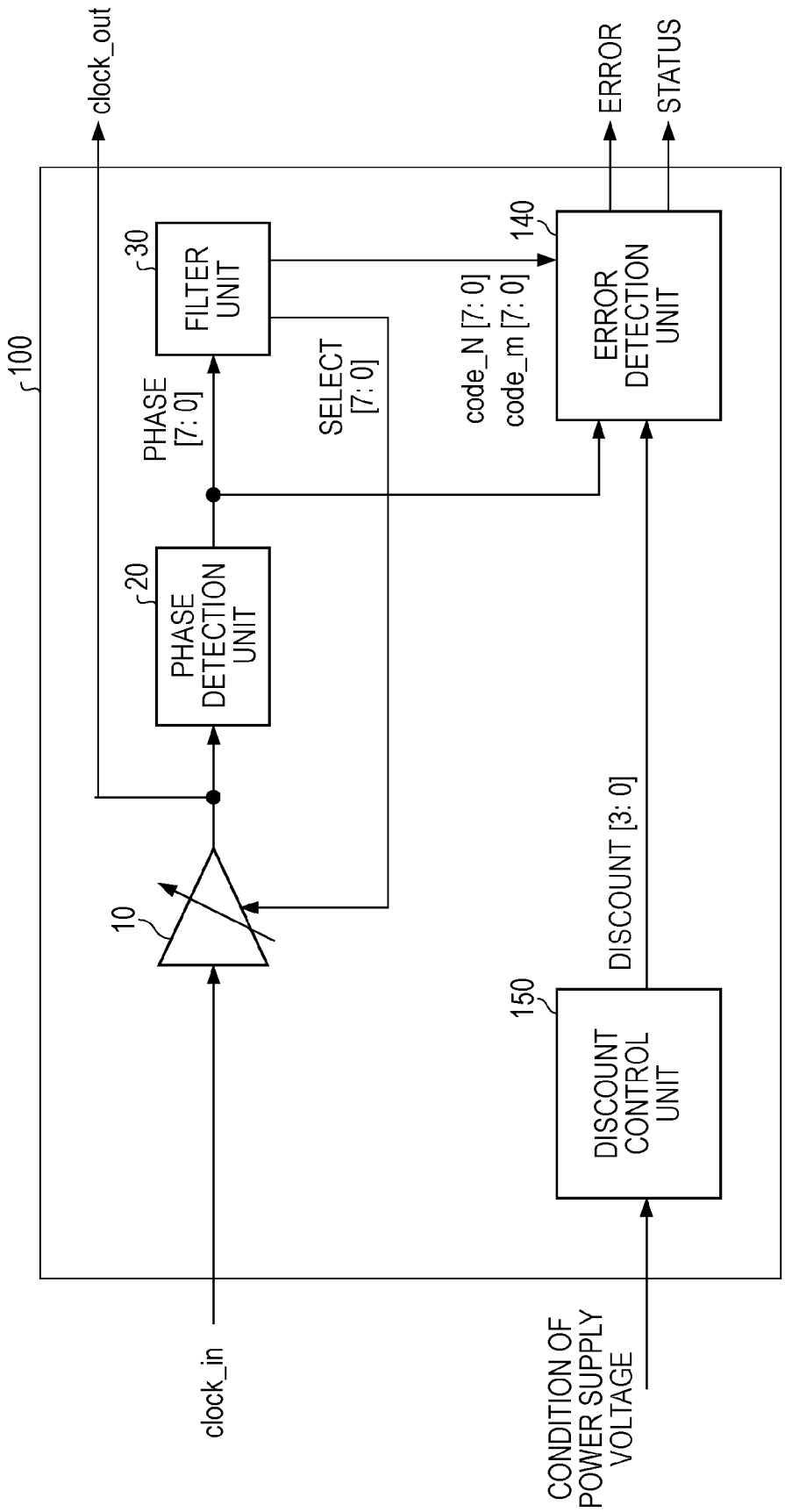
FIG. 6 is a diagram illustrating a signal delay circuit included in the semiconductor apparatus in Embodiment 1.

FIG. 6 is a diagram illustrating the signal delay circuit 100 included in the semiconductor apparatus in Embodiment 1.

The signal delay circuit 100 includes the delay unit 10, the phase detection unit 20, the filter unit 30, an error detection unit 140, and a discount control unit 150.

The error detection unit 140 in the signal delay circuit 100 has a configuration different from that of the error detection unit 40 in the signal delay circuit 1 of the comparative example. The signal delay circuit 100 is different from the signal delay circuit 1 of the comparative example in that the signal delay circuit 100 includes the discount control unit 150.

In the signal delay circuit 100, the phase detection unit 20 outputs an 8-bit phase signal, phase[7:0], and the filter unit 30 outputs an 8-bit signal, select[7:0] and 8-bit codes code_N[7:

0] and code_m[7:0] that indicate the range of phase for stable operation. The code code_N[7:0] indicates an upper limit phase N of the range of phase for stable operation, and the code code_m[7:0] indicates a width m of the range of phase for stable operation.

A discount signal discount[3:0] is inputted from the discount control unit 150 to the error detection unit 140 of the signal delay circuit 100.

Parts of the configuration other than what is described above are the same as those of the signal delay circuit 1 of the comparative example, and the signal delay circuit 100 outputs a clock (clock_out) which is an input clock (clock_in) with a delay added thereto, the input clock being inputted to the delay unit 10.

Hereinafter, the components identical or equivalent to those of the signal delay circuit 1 of the comparative example are labeled with the same reference symbols, and description is omitted.

First, the phase detection unit 20 is described with reference to FIG. 7.

Figure 7:
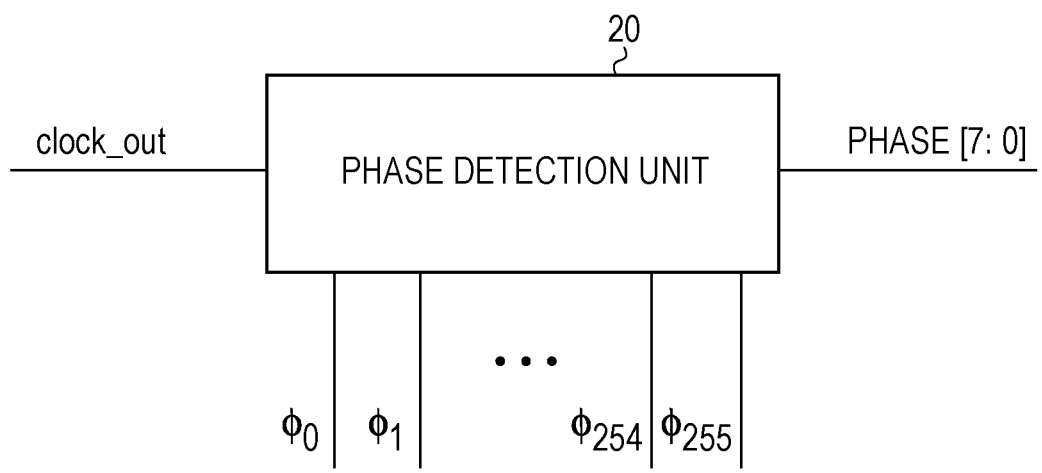
FIG. 7 is a diagram illustrating a phase detection unit of a signal delay circuit included in the semiconductor apparatus in Embodiment 1.

FIG. 7 is a diagram illustrating the phase detection unit 20 of the signal delay circuit 100 included in the semiconductor apparatus in Embodiment 1.

A clock (clock_out) outputted from the delay unit 10 is inputted to the phase detection unit 20. In addition, multiphase clocks 0 to 255 are inputted to the phase detection unit 20. The multiphase clocks 0 to 255 are those clocks that are obtained by adding a unit phase successively to a clock (clock_in), the unit phase being obtained by dividing one cycle of the clock (clock_in) by 256.

The clock 0 is in phase with the clock (clock_in); the clock 1 is advanced by one unit phase from the clock (clock_in); the clock 254 is advanced by 254 unit phases from the clock (clock_in); and the clock 255 is advanced by 255 unit phases from the clock (clock_in).

The phase detection unit 20 compares the clock (clock_out) outputted from the delay unit 10 with multiphase clocks 0 to 255 so as to detect the phase of a clock out of the multiphase clocks 0 to 255, as the clock (clock_out) phase to be outputted from the delay unit 10, where the detected clock has substantially the same phase as the clock (clock_out) outputted from the delay unit 10.

The phase detection unit 20 outputs an 8-bit phase signal phase[7:0] indicating the detected phase.

Next, the error detection unit 140 is described. The error detection unit 140 is different from the error detection unit 40 of the signal delay circuit 1 of the comparative example in that the error detection unit 140 discounts the number of times (count number) when the phase is out of the acceptable range, in accordance with the operating conditions of the signal delay circuit 100 or the semiconductor apparatus including the signal delay circuit 100.

The discount control unit 150 is connected to the error detection unit 140, and a discount signal discount[3:0] is inputted from the discount control unit 150 to the error detection unit 140. The discount signal discount[3:0] is generated by the discount control unit 150 in accordance with the operating conditions of the signal delay circuit 100 or the semiconductor apparatus including the signal delay circuit 100.

The error detection unit 140 discounts the number of times (count number) when the phase is out of the acceptable range based on the discount signal discount[3:0] that is generated in accordance with the operating conditions of the semiconductor apparatus.

The reason why the error detection unit 140 discounts the count number is that when the variation in the clock phase due to the operating conditions is relatively small, the entire system may be smoothly and stably operated by rather continuing the operation of the system including the signal delay circuit 100 without making an error determination by the error detection unit 140.

The operating conditions of the semiconductor apparatus or the external factors for causing deviation of a clock phase from the range of phase for stable operation (N−m to N) include, for example, a fluctuation of the power supply voltage of the semiconductor apparatus, and a fluctuation of the temperature of the semiconductor apparatus.

The phase of the clock (clock_out) outputted by the delay unit 10 included in the semiconductor apparatus is affected by the power supply voltage supplied to the delay unit 10 (power supply voltage supplied to the semiconductor apparatus), and thus the range of the variation in the phase varies. For example, when the fluctuation range of the power supply voltage is 5%, 10%, or 15%, the variation range of the clock (clock_out) phase has the minimum value in the case of 5%, and has the maximum value in the case of 15%.

The phase of the clock (clock_out) outputted by the delay unit 10 included in the semiconductor apparatus is also affected by the temperature of the delay unit 10 (temperature of the semiconductor apparatus), and thus the range of the variation in the phase varies. The temperature of the delay unit 10 varies with the environment in which the semiconductor apparatus is used, as well as with heat generation amount due to an operation or the like of the semiconductor apparatus.

As the fluctuation range of the temperature of the delay unit 10 or the semiconductor apparatus increases, the variation range of the clock (clock_out) phase increases, while as the fluctuation range of the temperature of the delay unit 10 or the semiconductor apparatus decreases, the variation range of the clock (clock_out) phase decreases.

The fluctuation range of the power supply voltage and the temperature of the semiconductor apparatus may be known in advance because of the operating conditions of the use environment or the like of the semiconductor apparatus, or may vary due to an external factor outside the semiconductor apparatus.

The error detection unit 140 of the signal delay circuit 100 in Embodiment 1 sets a degree of discounting the number of times (count number) when the phase is out of the acceptable range, in accordance with the operating conditions of the semiconductor apparatus.

A signal delay circuit configured to discount the number of times (count number) when the phase is out of the acceptable range, in accordance with an external factor outside the semiconductor apparatus is described in Embodiments 2 and 4.

Figure 8:
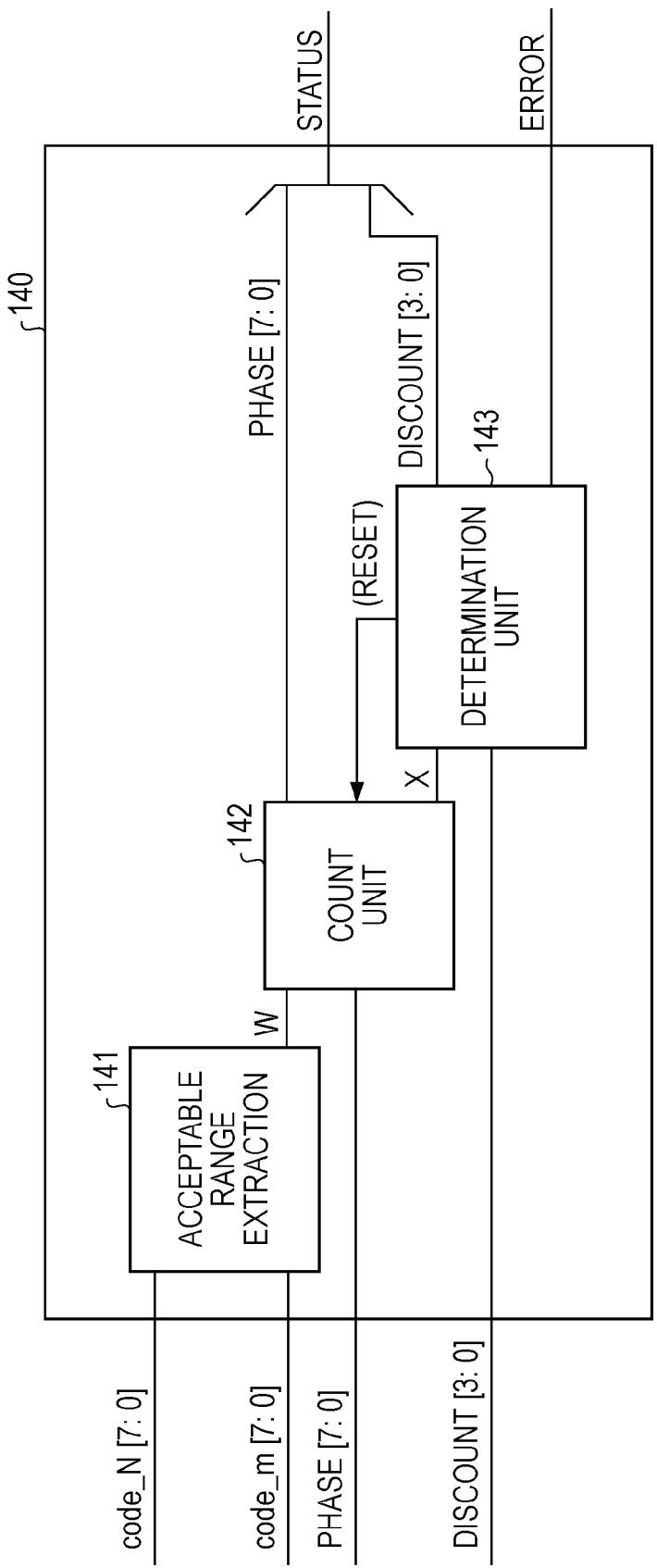
FIG. 8 is a diagram illustrating the internal configuration of an error detection unit of the signal delay circuit in Embodiment 1.

Here, the internal configuration of the error detection unit 140 is described. FIG. 8 is a diagram illustrating the internal configuration of the error detection unit 140 of the signal delay circuit 100 in Embodiment 1.

The error detection unit 140 includes an acceptable range extraction unit 141, a counting unit 142, and a determination unit 143.

The acceptable range extraction unit 141 extracts the acceptable range (N−m to N) based on the codes code_N[7:0] and code_m[7:0] that are outputted from the filter unit 30, and inputs an acceptable range signal W indicating the acceptable range to the counting unit 142.

The counting unit 142 counts the number of times that the phase is outside of the acceptable range based on the phase signal phase[7:0] outputted from the phase detection unit 20 and the acceptable range signal W outputted from the acceptable range extraction unit 141, and inputs a count signal X indicating the count number to the determination unit 143.

The determination unit 143 determines whether or not an error has occurred in the clock (clock_out) phase based on the discount signal discount[3:0] outputted from the discount control unit 150 and the count signal X outputted from the counting unit 142.

The determination unit 143, when determining that an error has occurred in the clock (clock_out) phase, outputs an error signal (error).

The discount signal discount[3:0] defines the number of detections (discount number) that is to be subtracted from the number of detections indicated by the count signal X.

For example, when the number of detections indicated by the discount signal discount[3:0] is 8 times, the determination unit 143 does not determine that an error has occurred in the clock (clock_out) phase while the number of detections indicated by the count signal X is in a range from 1 to 8 times.

When the number of detections indicated by the count signal X reaches 9, the determination unit 143 determines that an error has occurred and outputs an error signal (error), while outputting a reset signal (reset) to reset the counting unit 142.

In this manner, the error detection unit 140 discounts the number of times (count number) when the phase is out of the acceptable range, based on the discount signal discount[3:0] that is generated in accordance with the operating conditions of the semiconductor apparatus.

The counting unit 142 outputs a phase signal phase[7:0] as a status signal (status), and the determination unit 143 outputs a discount signal discount[3:0] as a status signal (status).

Next, the discount control unit 150 (see FIG. 6) that is connected to the error detection unit 140 of the signal delay circuit 100 is described.

The discount control unit 150 (see FIG. 6) which is connected to the error detection unit 140 of the signal delay circuit 100 in Embodiment 1 receives an input of a signal indicating a specified condition for power supply voltage as an operating condition of the semiconductor apparatus.

The term specified condition of power supply voltage refers to a fluctuation range of the power supply voltage, for example, 5%, 10%, or 15%. The signal indicating the specified condition of power supply voltage is inputted from the supervisory channel of the system.

The specified condition of power supply voltage is determined by the type or the like of the server 50 including the signal delay circuit 100, and is not be changed.

A combinational circuit, for example, may be used as the discount control unit 150. The discount control unit 150 generates a discount signal discount[3:0] based on the signal indicating the specified condition of power supply voltage, and inputs the discount signal discount[3:0] to the error detection unit 140.

The value of the discount signal discount[3:0] outputted by the discount control unit 150 is set in accordance with the signal indicating the specified condition of power supply voltage.

For example, in a server 50 with the specified condition of power supply voltage of 5%, the discount number indicated by the discount signal discount[3:0] outputted from the discount control unit 150 is, for example, "0."

In addition, in a server 50 with the specified condition of power supply voltage of 10%, the discount number indicated by the discount signal discount[3:0] outputted from the discount control unit 150 is, for example, "8."

Similarly, in a server 50 with the specified condition of power supply voltage of 15%, the discount number indicated by the discount signal discount[3:0] outputted from the discount control unit 150 is, for example, "15."

Figure 9:
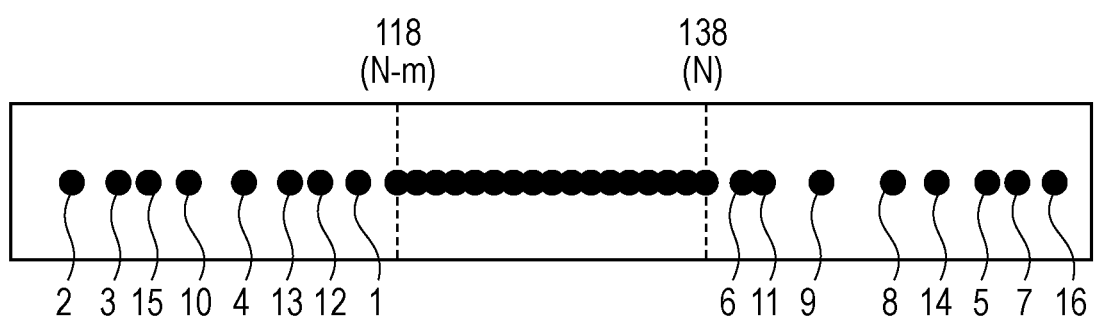
FIG. 9 is a diagram illustrating the concept of discount of a count number in the error detection unit.

Next, how the count number is discounted is described by using an exemplary relationship between the phases of the clock (clock_out) outputted by the delay unit 10 and the acceptable range extracted by the acceptable range extraction unit 141 that are illustrated in FIG. 9.

FIG. 9 is a diagram illustrating the concept of discount of the count number in the error detection unit 140.

The acceptable range (N−m to N) illustrated in FIG. 9 is from 118 to 138. This corresponds to the case where the upper limit phase N of the acceptable range indicated by the code code_N[7:0] is 138, and the width m of the acceptable range indicated by the code_m[7:0] is 20.

The 16 plots labeled with numbers 1 to 16 illustrated in FIG. 9 indicate the phases that are out of the acceptable range (118 to 138).

The plots that are out of the acceptable range (118 to 138) illustrated in FIG. 9 are exemplary plots. The ratio between the number of plots out of the acceptable range (118 to 138) and the number of plots falling within the acceptable range (118 to 138) illustrated in FIG. 9 is not the ratio in an actual signal delay circuit 100, but is an exaggerated ratio for ease of illustration.

The actual signal delay circuit 100 detects a phase out of the acceptable range at most several times discretely while detecting a phase, for example, 10,000 times.

Here, as an example, it is assumed that the discount number is "0" when the fluctuation range of the power supply voltage is 5%, the discount number is "8" when the fluctuation range is 10%, and the discount number is "15" when the fluctuation range is 15%.

This correspond to three cases where the discount numbers indicated by the discount signal discount[3:0] are "0", "8", and "15", respectively.

Under such a condition, the discount number is "0" when the fluctuation range of the power supply voltage is 5%, and thus, when a phase labeled with the number 1 is detected, the determination unit 143 in the error detection unit 140 determines that an error has occurred, and outputs an error signal (error).

When the fluctuation range of the power supply voltage is 10%, the discount number is "8", and thus the determination unit 143 in the error detection unit 140 does not determine that an error has occurred while detecting one of the phases labeled with the numbers 1 to 8. The determination unit 143, when detecting the phase labeled with the number 9, determines that an error has occurred, and outputs an error signal (error).

Similarly, when the fluctuation range of the power supply voltage is 15%, the discount number is "15", and thus the determination unit 143 in the error detection unit 140 does not determine that an error has occurred while detecting one of the phases labeled with the numbers 1 to 16. The determination unit 143, when detecting a phase labeled with the number 17 (not illustrated in FIG. 9) that is out of the acceptable range, determines that an error has occurred, and outputs an error signal (error).

As described above, according to the signal delay circuit 100 included in the semiconductor apparatus in Embodiment 1, when the clock phase varies due to the fluctuation range of the power supply voltage, which is an example of the operating conditions, and consequently a phase out of the acceptable range is detected, the count number is discounted in accordance with the fluctuation range of the power supply voltage.

Therefore, erroneous detection may be avoided, and thus smooth and stable operation of the entire semiconductor apparatus including the signal delay circuit 100 in Embodiment 1 may be secured.

In addition, the discount number is set in accordance with the fluctuation range of the power supply voltage, and the count number is discounted in accordance with the operating conditions while securing the responsiveness of the signal delay circuit 100, and thus smooth and stable operation of the signal delay circuit 100 and the semiconductor apparatus including the signal delay circuit 100 may be secured in accordance with the operating conditions.

Additionally, the signal delay circuit 100 in Embodiment 1 does not include a plurality of variable delay circuits, majority circuits, and number of majority decision setting registers unlike a conventional semiconductor circuit apparatus, and thus the signal delay circuit 100 is not increased in size, and may be miniaturized.

[Embodiment 2]

A signal delay circuit 200 in Embodiment 2 is different from the signal delay circuit 100 of Embodiment 1 in that a discount signal discount[3:0] with varied discount number is inputted in accordance with a fluctuation of the power supply voltage as an example of an external factor.

Because the configuration other than what is described above is similar to that of Embodiment 1, the components identical or equivalent to those of the signal delay circuit 100 in Embodiment 1 are labeled with the same reference symbols, and description is omitted.

Figure 10:
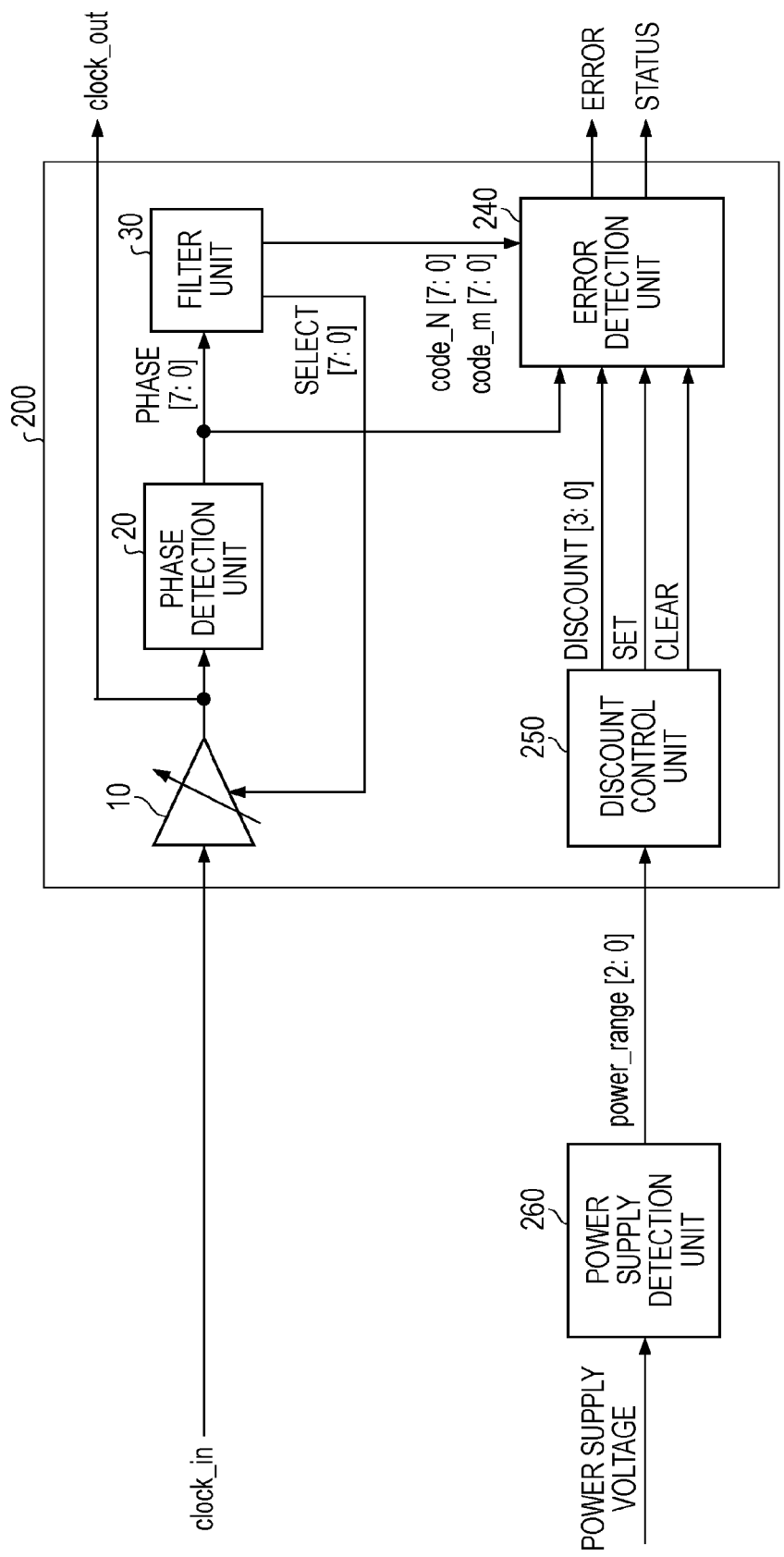
FIG. 10 is a diagram illustrating a signal delay circuit included in a semiconductor apparatus in Embodiment 2.

FIG. 10 is a diagram illustrating the signal delay circuit 200 included in the semiconductor apparatus in Embodiment 2.

In addition to a discount signal discount[3:0], a set signal (set) and a clear signal (clear) are inputted from a discount control unit 250 to an error detection unit 240 of the signal delay circuit 200.

The error detection unit 240 is different from the error detection unit 140 of the signal delay circuit 100 of Embodiment 1 in that the error detection unit 240 discounts the number of times (count number) when the phase is out of the acceptable range, in accordance with an external factor of the signal delay circuit 200 or the semiconductor apparatus including the signal delay circuit 200.

The discount control unit 250 is connected to the error detection unit 240, and a discount signal discount[3:0] is inputted from the discount control unit 250 to the error detection unit 240.

The error detection unit 240 discounts the number of times (count number) when the phase is out of the acceptable range, based on the discount signal discount[3:0] that is generated in accordance with an external factor of the semiconductor apparatus.

The reason why the error detection unit 240 discounts the count number is that when the variation in the clock phase due to the operating conditions is relatively small, the entire system may be smoothly and stably operated by rather continuing the operation of the system including the signal delay circuit 200 without making an error determination by the error detection unit 240.

Figure 11:
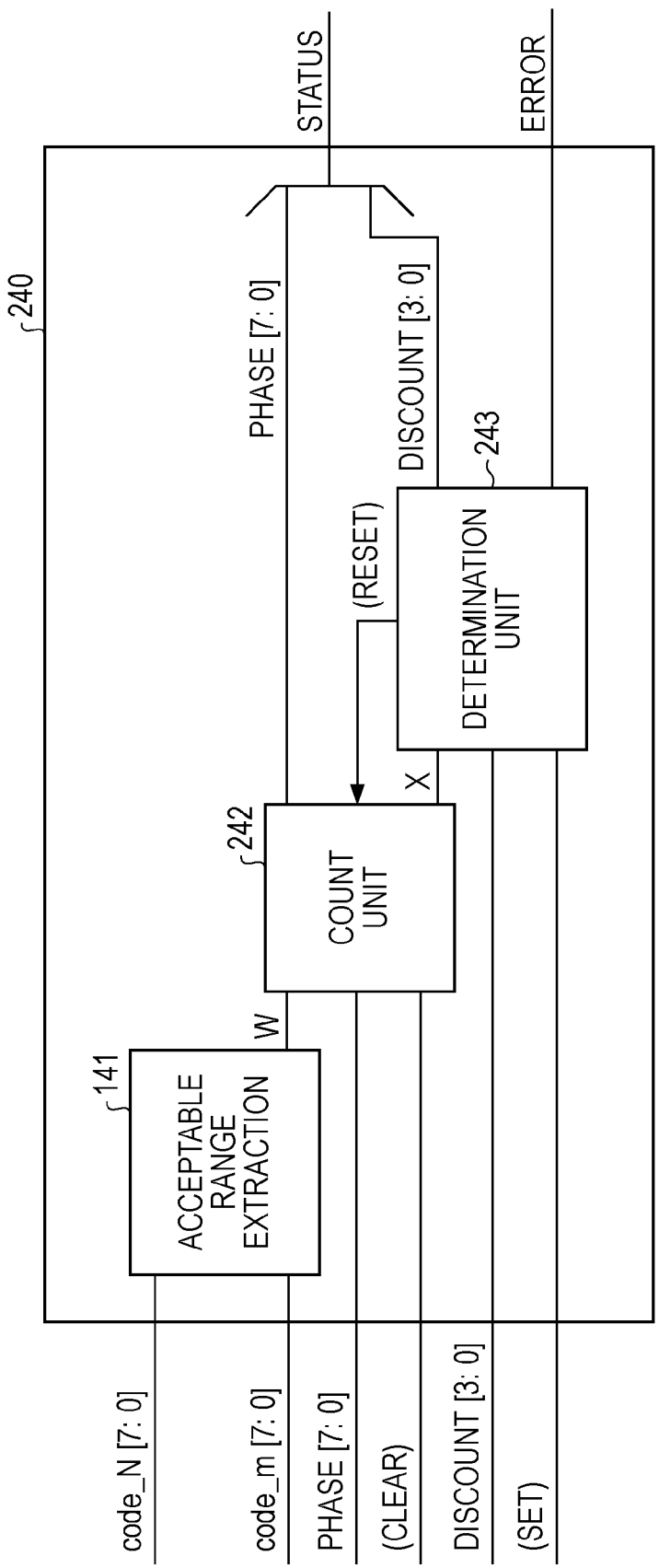
FIG. 11 is a diagram illustrating the internal configuration of an error detection unit of the signal delay circuit in Embodiment 2.

FIG. 11 is a diagram illustrating the internal configuration of the error detection unit 240 of the signal delay circuit 200 in Embodiment 2.

The error detection unit 240 includes the acceptable range extraction unit 141, a counting unit 242, and a determination unit 243.

The acceptable range extraction unit 141 is similar to the acceptable range extraction unit 141 in Embodiment 1, and extracts the acceptable range (N−m to N) based on the codes code_N[7:0] and code_m[7:0] that are outputted from the filter unit 30, and inputs an acceptable range signal W indicating the acceptable range to the counting unit 242.

The counting unit 242 counts the number of times when the phase is out of the acceptable range based on the phase signal phase[7:0] outputted from the phase detection unit 20 and the acceptable range signal W outputted from the acceptable range extraction unit 141, and inputs a count signal X indicating the count number to the determination unit 243.

A clear signal (clear) is inputted from the discount control unit 250 to the counting unit 242. A clear signal (clear) is a signal to clear the count value of the counting unit 242.

The determination unit 243 determines whether or not an error has occurred in the clock (clock_out) phase based on the discount signal discount[3:0] outputted from the discount control unit 250 and the count signal X outputted from the counting unit 242.

The determination unit 243, when determining that an error has occurred in the clock (clock_out) phase, outputs an error signal (error).

A set signal (set) is inputted from the discount control unit 250 to the determination unit 243. The set signal (set) is described later.

In addition, when an error occurs in the phase, the determination unit 243 outputs an error signal (error), while outputting a reset signal (reset) to reset the counting unit 242.

When the discount number indicated by the discount signal discount[3:0] that is outputted from the discount control unit 250 is changed, the determination unit 243 makes an error determination using the changed discount number.

For example, when the detection number indicated by the discount signal discount[3:0] is changed from 0 to 8 times, the determination unit 243 does not determine that an error has occurred in the clock (clock_out) phase while the number of detections indicated by the count signal X is in a range from 1 to 8 times. When the number of detections indicated by the count signal X reaches 9, the determination unit 243 determines that an error has occurred and outputs an error signal (error).

In this manner, the error detection unit 240 discounts the number of times (count number) when the phase is out of the acceptable range, based on the discount signal discount[3:0] that varies in accordance with an external factor of the semiconductor apparatus.

Here, before describing the discount control unit 250 (see FIG. 10), a power supply voltage detection unit 260 is described.

The power supply voltage detection unit 260 detects a fluctuation of the power supply voltage of the delay unit 10, and converts the fluctuation to a digital number, then outputs a 3-bit power supply voltage signal power_range[2:0] indicating a value of fluctuation occurs in the power supply voltage of the delay unit 10. The power supply voltage detection unit 260 detects, for example, a fluctuation of the power supply voltage, and may use a voltage sensor that may output a digital signal indicating the fluctuation of the power supply voltage.

Next, the discount control unit 250 (see FIG. 10) that is connected to the error detection unit 240 of the signal delay circuit 200 is described.

A signal indicating a fluctuation of the power supply voltage as an external factor of the semiconductor apparatus is inputted to the discount control unit 250 (see FIG. 10) which is connected to the error detection unit 240 of the signal delay circuit 100 in Embodiment 2.

Here, a fluctuation of the power supply voltage and a variation in the clock (clock_out) phase have a correlation with each other. For example, when a fluctuation of the power supply voltage increases from 5% to 10%, and further to 15%, a variation in the clock (clock_out) phase becomes larger accordingly.

Such a fluctuation of the power supply voltage is detected by the power supply voltage detection unit 260 which is connected to the discount control unit 250.

The discount control unit 250 generates a discount signal discount[3:0] based on the power supply voltage signal power_range[2:0] which is inputted from the power supply voltage detection unit 260. The power supply voltage signal power_range[2:0] which is inputted from the power supply voltage detection unit 260 indicates a fluctuation of the power supply voltage.

When a fluctuation of the power supply voltage detected by the power supply voltage detection unit 260 increases in the absolute value, the discount control unit 250 increases the discount number indicated by the discount signal discount[3:0] accordingly.

Similarly, when a fluctuation of the power supply voltage detected by the power supply voltage detection unit 260 decreases in the absolute value, the discount control unit 250 decreases the discount number indicated by the discount signal discount[3:0] accordingly.

Next, the internal configuration of the discount control unit 250 is described with reference to FIG. 12.

Figure 12:
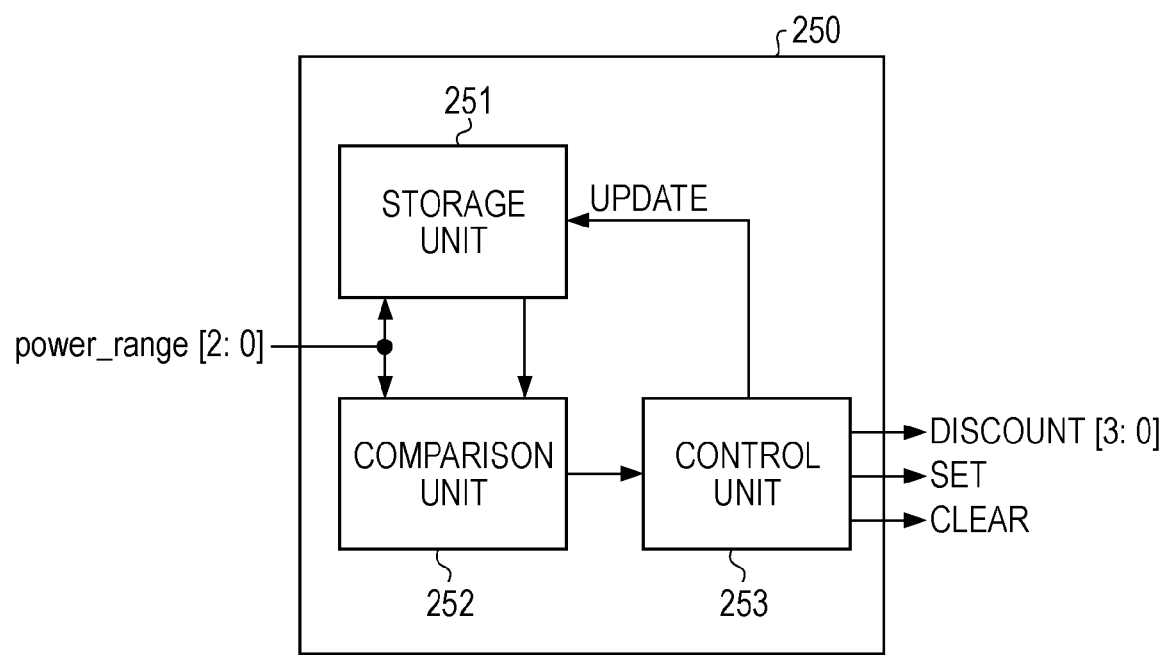
FIG. 12 is a diagram illustrating a discount control unit which is connected to the signal delay circuit included in the semiconductor apparatus in Embodiment 2.

FIG. 12 is a diagram illustrating the discount control unit 250 which is connected to the signal delay circuit 200 included in the semiconductor apparatus in Embodiment 2.

The discount control unit 250 includes a storage unit 251, a comparison unit 252, and a control unit 253. The discount control unit 250 generates a discount signal discount[3:0] based on the power supply voltage signal power_range[2:0].

The storage unit 251 stores a value, as the storage data, which is used by the comparison unit 252 for comparison of the power supply voltage signal power_range[2:0]. When a update signal (update) is inputted from the control unit 253, the storage data is set by introducing the value of the power supply voltage signal power_range[2:0]. As the storage unit 251, for example, a register or a memory may be used.

The comparison unit 252 compares the power supply voltage signal power_range[2:0] inputted from the power supply voltage detection unit 260 with the storage data stored by the storage unit 251, and outputs a comparison result signal indicating a result of the comparison to the control unit 253.

The control unit 253 performs an update process on the discount signal discount[3:0] based on the comparison result signal inputted from the comparison unit 252. The control unit 253 performs an update process on the discount signal discount[3:0], while outputting a set signal (set), a clear signal (clear), and an update signal (update). The update process of the discount signal discount[3:0], respective timings when the set signal (set) and the clear signal (clear) are outputted are described later.

Next, a correspondence between the 3-bit power supply voltage signal power_range[2:0] and the 4-bit discount signal discount[3:0] is described with reference to FIGS. 13A and 13B.

FIGS. 13A and 13B are tables each illustrating a correspondence between the value of an input signal (power supply voltage signal power_range[2:0]) and the value of an output signal (discount signal discount[3:0]) of the discount control unit 250 of the signal delay circuit 200 in Embodiment 2.

FIGS. 13A and 13B include two types of correspondences: the correspondence illustrated in FIG. 13A, and the correspondence illustrated in FIG. 13B.

The discount control unit 250 generates a 4-bit discount signal discount[3:0] as the correspondence illustrated in FIG. 13A or 13B based on a 3-bit power supply voltage signal power_range[2:0].

Here, a fluctuation of the power supply voltage is expressed in terms of a percentage with respect to the power supply voltage, and FIG. 13A illustrates a conversion table with columns for respective sub-ranges with a width of 2.5% in the entire range of 0(%) to 17.5(%) or more of the fluctuation of the power supply voltage in the absolute value.

The power supply voltage may fluctuate up or down, and thus the value indicating a fluctuation of the power supply voltage is labeled with symbol in FIG. 13A.

In addition, in order to describe upward and downward fluctuations simultaneously below, the values of a fluctuation of the power supply voltage are sorted by the absolute value, and the correspondence between the 3-bit power supply voltage signal power_range[2:0] and the 4-bit discount signal discount[3:0] is described.

First, the correspondence illustrated in FIG. 13A is described. As illustrated in FIG. 13A, the 3-bit power supply voltage signal power_range[2:0] is assigned with "0" when the absolute value of the fluctuation is less than 2.5(%), is assigned with "6" when the absolute value is 15(%) or greater and less than 17.5(%), and is assigned with "7" when the absolute value is 17.5(%) or greater.

On the other hand, the 4-bit discount signal discount[3:0] is assigned with "0" when the absolute value of the fluctuation is less than 2.5(%), is assigned with "12" when the absolute value is 15(%) or greater and less than 17.5(%), and is assigned with "14" when the absolute value is 17.5(%) or greater.

For example, when the fluctuation of the power supply voltage is −6.5(%), and the 3-bit power supply voltage signal power_range[2:0] indicates "2", a 4-bit discount signal discount[3:0] indicating "4" is generated.

FIG. 13B illustrates a conversion table for coding the signals with a scale of the fluctuation of the power supply voltage, larger than that of FIG. 13A, and in the conversion table of FIG. 13B, the fluctuation of the power supply voltage is incremented by 5% in the absolute value.

As illustrated in FIG. 13B, the 3-bit power supply voltage signal power_range[2:0] is assigned with "0" when the absolute value of the fluctuation is less than 5(%), is assigned with "2" when the absolute value is 10(%) or greater and less than 15(%), and is assigned with "3" when the absolute value is 15(%) or greater.

On the other hand, the 4-bit discount signal discount[3:0] is assigned with "0" when the absolute value of the fluctuation is less than 5(%), is assigned with "8" when the absolute value is 10(%) or greater and less than 15(%), and is assigned with "12" when the absolute value is 15(%) or greater.

For example, when the fluctuation of the power supply voltage is −6.5(%), and the 3-bit power supply voltage signal power_range[2:0] indicates "1", a 4-bit discount signal discount[3:0] indicating "4" is generated.

The discount control unit 250 generates a 4-bit discount signal discount[3:0] based on a 3-bit power supply voltage signal power_range[2:0] by using the conversion table illustrated in FIG. 13A or 13B.

Next, the operation of the signal delay circuit 200 in Embodiment 2 is described with reference to FIG. 14.

Figure 14A:
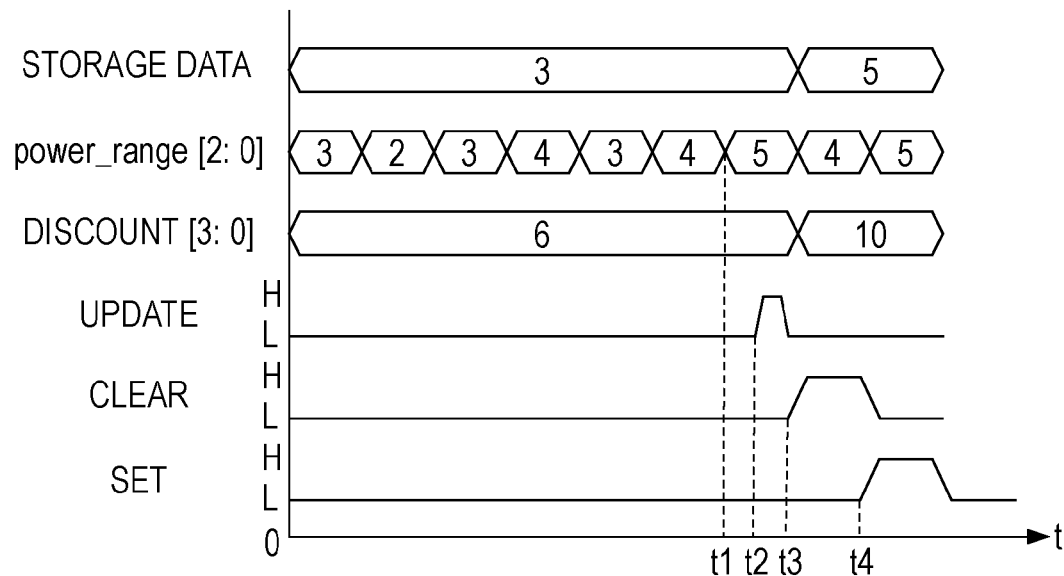
FIGS. 14A and 14B are timing charts each illustrating an operation of the signal delay circuit in Embodiment 2.
Figure 14B:
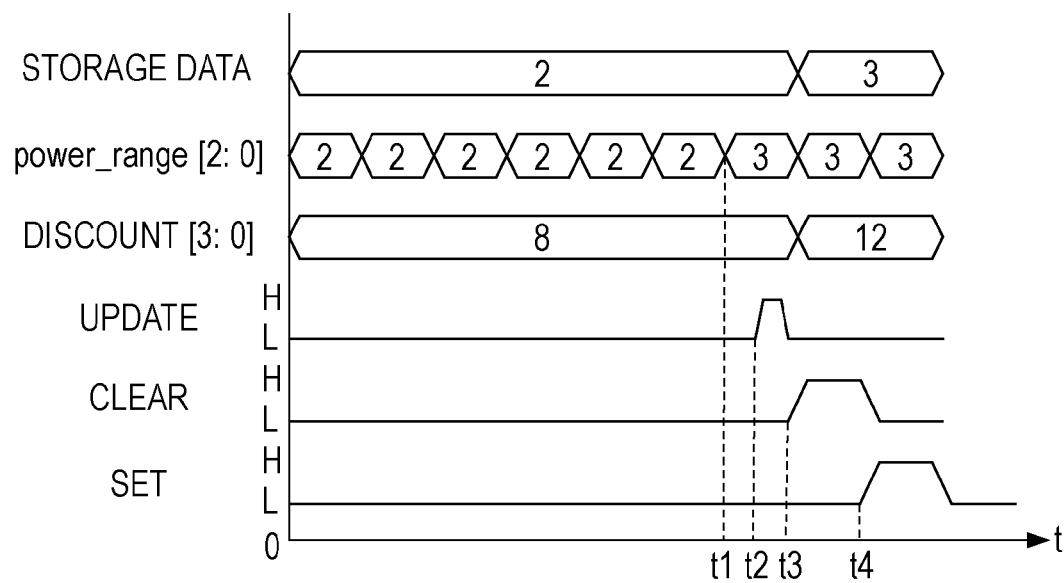

FIGS. 14A and 14B are timing charts each illustrating the operation of the signal delay circuit 200 in Embodiment 2. FIG. 14A illustrates the operation when the conversion table illustrated in FIG. 13A is used, and FIG. 14B illustrates the operation when the conversion table illustrated in FIG. 13B is used.

FIG. 14A illustrates the storage data stored by the storage unit 251, the power supply voltage signal power_range[2:0], the discount signal discount[3:0], the update signal (update), the clear signal (clear), and the set signal (set) that are outputted by the power supply voltage detection unit 260. In FIG. 14A, the horizontal axis is the time axis.

In the exemplary operation illustrated in FIG. 14A, it is assumed that when the code difference between the storage data and the power supply voltage signal power_range[2:0] (hereinafter referred to as a current power supply voltage signal power_range[2:0]) outputted by the power supply voltage detection unit 260 becomes "2" or greater, update data is updated.

It is assumed that the fluctuation of the power supply voltage is +8% at t=0, and the power supply voltage signal power_range[2:0] stored as the storage data is "3." It is also assumed that the power supply voltage signal power_range[2:0] which is outputted by the power supply voltage detection unit 260 is "3."

At this point, the discount signal discount[3:0] is "3" as seen from the conversion table of FIG. 13A. It is also assumed that an update signal (update), a clear signal (clear), and a set signal (set) are all at L (Low) level.

As the time elapses, a fluctuation of the power supply voltage occurs, and the value of the current power supply voltage signal power_range[2:0] changes from "3" at t=0, to "2", "3", "4", "3", "4", and "5" at time t1.

At the time t1, the code difference between the storage data of "3" and the power supply voltage signal power_range[2:0] of "5" becomes "2" or greater for the first time.

Thus, the update signal (update) is set to H (High) level at time t2, and, accordingly the update data is updated to "5."

When the clear signal (clear) is set to H level at time t3, the count value of the counting unit 242 (see FIG. 11) is cleared.

Further, when the set signal (set) is set to H level at time t4, the discount signal discount[3:0] of the determination unit 243 (see FIG. 11) is set to "10."

The operation illustrated in FIG. 14A corresponds to the event, for example, that the fluctuation of the power supply voltage changes from +8% at time t=0, to +14% at time t4.

By changing the discount signal discount[3:0] in accordance with the fluctuation of the power supply voltage in the above manner, the signal delay circuit 200 in Embodiment 2 may avoid erroneous detection, and may secure smooth and stable operation.

Next, the exemplary operation in FIG. 14B is described.

Similarly to FIG. 14A, FIG. 14B illustrates the storage data stored by the storage unit 251, the current power supply voltage signal power_range[2:0], the discount signal discount[3:0], the update signal (update), the clear signal (clear), and the set signal (set). In FIG. 14B, the horizontal axis is the time axis.

In the exemplary operation illustrated in FIG. 14B, it is assumed that when the code difference between the storage data and the current power supply voltage signal power_range[2:0] becomes "1" or greater, update data is updated.

It is assumed that the fluctuation of the power supply voltage is +11% at t=0, and the power supply voltage signal power_range[2:0] stored as the storage data is "2." It is also assumed that the power supply voltage signal power_range[2:0] which is outputted by the power supply voltage detection unit 260 is "2."

At this point, the discount signal discount[3:0] is "8" as seen from the conversion table of FIG. 13B. It is also assumed that the update signal (update), the clear signal (clear), and the set signal (set) are all at L (Low) level.

As the time elapses, a fluctuation of the power supply voltage occurs, and the value of the current power supply voltage signal power_range[2:0] changes from "2" at t=0, to "3" at time t1, while being maintained at "2" between 0 and t1.

At the time t1, the code difference between the storage data of "2" and the current power supply voltage signal power_range[2:0] of "3" becomes "1" or greater for the first time.

Thus, the update signal (update) is set to H (High) level at time t2, and, accordingly the update data is updated to "3."

When the clear signal (clear) is set to H level at time t3, the count value of the counting unit 242 (see FIG. 11) is cleared.

In addition, when the set signal (set) is set to H level at time t4, the discount signal discount[3:0] of the determination unit 243 (see FIG. 11) is set to "12."

The operation illustrated in FIG. 14B corresponds to the event, for example, that the fluctuation of the power supply voltage changes from +11% at time t=0, to +15% at time t4.

By changing the discount signal discount[3:0] which is held by the determination unit 243 in the error detection unit 240 in accordance with the fluctuation of the power supply voltage as described above, the signal delay circuit 200 in Embodiment 2 may avoid erroneous detection in accordance with the fluctuation of the power supply voltage, and may secure smooth and stable operation.

As described above, according to the signal delay circuit 200 included in the semiconductor apparatus in Embodiment 2, when the clock phase varies due to the fluctuation of the power supply voltage, which is an example of an external factor, and consequently a phase out of the acceptable range is detected, the count number is discounted in accordance with the fluctuation range of the power supply voltage.

Therefore, erroneous detection may be avoided, and thus smooth and stable operation of the entire semiconductor apparatus including the signal delay circuit 200 in Embodiment 2 may be secured.

In addition, the discount number is changed in accordance with the fluctuation of the power supply voltage, and the count number is discounted in accordance with an external factor while securing the responsiveness of the signal delay circuit 200, and thus smooth and stable operation of the signal delay circuit 200 and the semiconductor apparatus including the signal delay circuit 200 may be secured in accordance with an external factor.

Additionally, the signal delay circuit 200 in Embodiment 2 does not include a plurality of variable delay circuits, majority circuits, and number of majority decision setting registers unlike a conventional semiconductor circuit apparatus, and thus the signal delay circuit 200 is not increased in size, and may be miniaturized.

[Embodiment 3]

Figure 15:
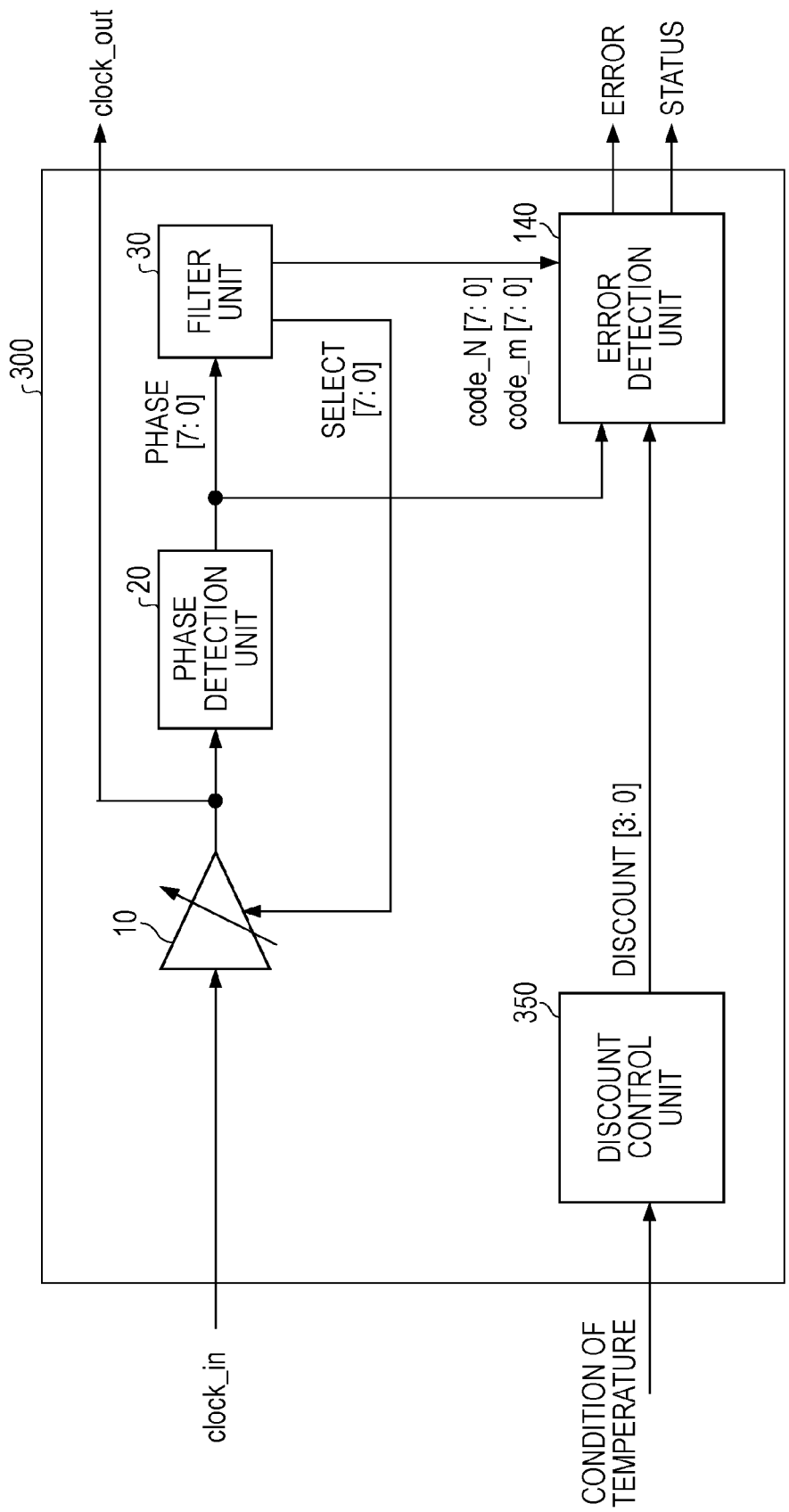
FIG. 15 is a diagram illustrating a signal delay circuit included in a semiconductor apparatus in Embodiment 3.

FIG. 15 is a diagram illustrating a signal delay circuit 300 included in a semiconductor apparatus in Embodiment 3.

The signal delay circuit 300 is different from the signal delay circuit 100 of Embodiment 1 in that the discount control unit 350 outputs a discount signal discount[3:0] indicating a fluctuation range of temperature.

Because the configuration other than what is described above is similar to that of the signal delay circuit 100 in Embodiment 1, the components identical or equivalent to those of the signal delay circuit 100 in Embodiment 1 are labeled with the same reference symbols, and description is omitted.

Here, the fluctuation range of temperature is a range of the environmental temperature at which a semiconductor apparatus or the server 50 (see FIGS. 4 and 5) including the signal delay circuit 300 in Embodiment 3 may be operated.

A signal indicating the specified condition of temperature as the operating conditions of semiconductor apparatus is inputted to the discount control unit 350 (see FIG. 15) which is connected to the error detection unit 140 of the signal delay circuit 300 in Embodiment 3.

The specified condition of temperature indicates a fluctuation range of temperature, for example, 30 to 50° C. or 20 to 60° C. The signal indicating the specified condition of temperature is inputted from the supervisory channel of the system.

The specified condition of temperature is determined by the type or the like of the server 50 including the signal delay circuit 300, and is not be changed.

A combinational circuit, for example, may be used as the discount control unit 350. The discount control unit 350 generates a discount signal discount[3:0] based on the signal indicating the specified condition of temperature, and inputs the discount signal discount[3:0] to the error detection unit 140.

The value of the discount signal discount[3:0] outputted by the discount control unit 350 is set in accordance with the signal indicating the specified condition of temperature.

For example, in a server 50 with the specified condition of temperature of 30 to 50° C., the discount number indicated by the discount signal discount[3:0] outputted from the discount control unit 350 is set to, for example, "2."

In addition, in a server 50 with the specified condition of temperature of 20 to 70° C., the discount number indicated by the discount signal discount[3:0] outputted from the discount control unit 350 is set to, for example, "4."

Figure 16:
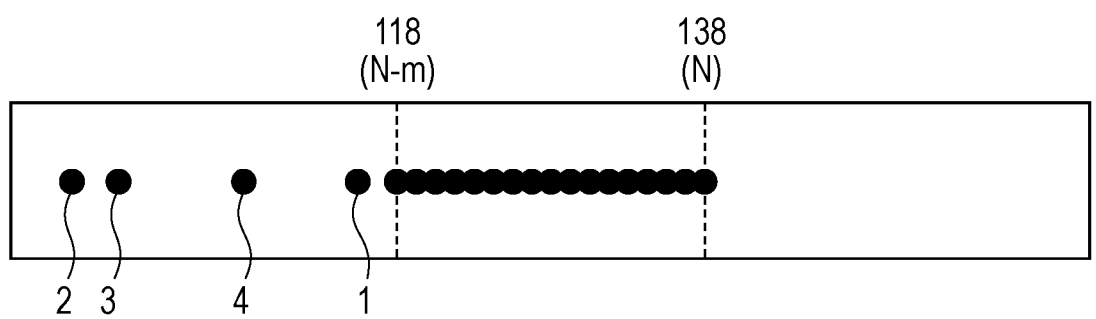
FIG. 16 is a diagram illustrating the concept of discount of the count number in the error detection unit.

Next, how the count number is discounted is described by using an exemplary relationship between the phases of the clock (clock_out) outputted by the delay unit 10 and the acceptable range extracted by the acceptable range extraction unit 141 that are illustrated in FIG. 16.

FIG. 16 is a diagram illustrating the concept of discount of the count number in the error detection unit 140.

The acceptable range (N−m to N) illustrated in FIG. 16 is from 118 to 138. This corresponds to the case where the upper limit phase N of the acceptable range indicated by the code code_N[7:0] is 138, and the width m of the acceptable range indicated by the code_m[7:0] is 20.

Those 4 plots labeled with numbers 1 to 4 illustrated in FIG. 16 indicate the phases that are out of the acceptable range (118 to 138).

The plots that are out of the acceptable range (118 to 138) illustrated in FIG. 9 are exemplary plots for the sake of illustration. The ratio between the number of plots out of the acceptable range (118 to 138) and the number of plots falling within the acceptable range (118 to 138) illustrated in FIG. 16 is not an ratio in actual signal delay circuit 300, but is an exaggerated ratio for the sake of illustration.

Here, as an example, it is assumed that the discount number is "2" when the specified condition of temperature is 30 to 50° C., and the discount number is "4" when the specified condition of temperature is 20 to 70° C.

These correspond to two cases where the discount numbers indicated by the discount signal discount[3:0] are "2" and "4", respectively.

Under such a condition, the discount number is "2" when the fluctuation range of temperature is 30 to 50° C., and thus, when a phase labeled with the number 3 is detected, the determination unit 143 in the error detection unit 140 determines that an error has occurred, and outputs an error signal (error).

On the other hand, the discount number is "4" when the fluctuation range of temperature is 20 to 70° C., and thus the determination unit 143 in the error detection unit 140 does not determine that an error has occurred while detecting one of the phases labeled with the numbers 1 to 4. The determination unit 143, when detecting a phase labeled with the number 5 (not illustrated in FIG. 16) that is out of the acceptable range, determines that an error has occurred, and outputs an error signal (error).

As described above, according to the signal delay circuit 300 included in the semiconductor apparatus in Embodiment 3, when the clock phase varies due to the fluctuation range of temperature, which is an example of the operating conditions, and consequently a phase out of the acceptable range is detected, the count number is discounted in accordance with the fluctuation range of temperature.

Therefore, erroneous detection may be avoided, and thus smooth and stable operation of the entire semiconductor apparatus including the signal delay circuit 300 in Embodiment 3 may be secured.

In addition, the discount number is set in accordance with the fluctuation range of temperature, and the count number is discounted in accordance with the operating conditions while securing the responsiveness of the signal delay circuit 300, and thus smooth and stable operation of the signal delay circuit 300 and the semiconductor apparatus including the signal delay circuit 300 may be secured in accordance with the operating conditions.

Additionally, the signal delay circuit 300 in Embodiment 3 does not include a plurality of variable delay circuits, majority circuits, and number of majority decision setting registers unlike a conventional semiconductor circuit apparatus, and thus the signal delay circuit 300 is not increased in size, and may be miniaturized.

[Embodiment 4]

A signal delay circuit 400 in Embodiment 4 is different from the signal delay circuit 300 of Embodiment 3 in that a discount signal discount[3:0] with varied discount number is inputted in accordance with a fluctuation of temperature as an example of an external factor.

Although the external factors used in Embodiments 2 and 4 are different, i.e., the fluctuation of the power supply voltage and the fluctuation of temperature, respectively, the signal delay circuit 400 in Embodiment 4 is similar to the signal delay circuit 200 in Embodiment 2 in a sense that the discount number is changed in accordance with an external factor of a semiconductor apparatus.

Thus, the components identical or equivalent to those of the signal delay circuit 200 in Embodiment 2 or the signal delay circuit 300 in Embodiment 3 are labeled with the same reference symbols, and description is omitted.

Figure 17:
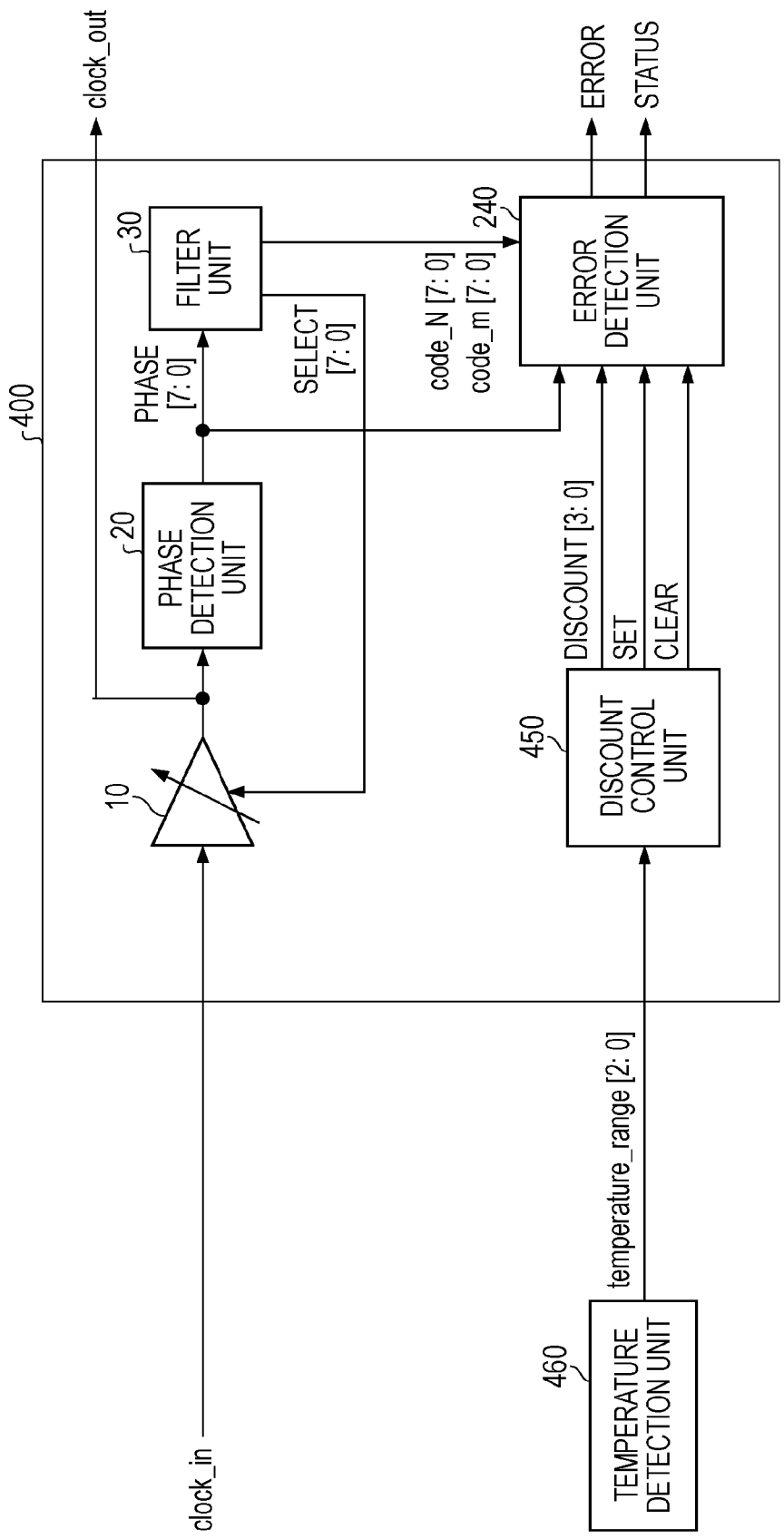
FIG. 17 is a diagram illustrating a signal delay circuit included in a semiconductor apparatus in Embodiment 4.

FIG. 17 is a diagram illustrating the signal delay circuit 400 included in the semiconductor apparatus in Embodiment 4.

In addition to a discount signal discount[3:0], a set signal (set) and a clear signal (clear) are inputted from a discount control unit 450 to an error detection unit 240 of the signal delay circuit 400.

The error detection unit 240 is different from the error detection unit 140 (see FIG. 15) of the signal delay circuit 300 of Embodiment 3 in that the error detection unit 240 discounts the number of times (count number) when the phase is out of the acceptable range, in accordance with an external factor of the signal delay circuit 400 or the semiconductor apparatus including the signal delay circuit 400.

The discount control unit 450 is connected to the error detection unit 240, and a discount signal discount[3:0] is inputted from the discount control unit 450 to the error detection unit 240.

The error detection unit 240 discounts the number of times (count number) when the phase is out of the acceptable range, based on the discount signal discount[3:0] that is generated in accordance with an external factor of the semiconductor apparatus.

The reason why the error detection unit 240 discounts the count number is that when the variation in the clock phase due to the operating conditions is relatively small, the entire system may be smoothly and stably operated by rather continuing the operation of the system including the signal delay circuit 400 without making an error determination by the error detection unit 240.

Here, before describing the discount control unit 450 (see FIG. 17), a temperature detection unit 460 is described.

The temperature detection unit 460 is attached to the delay unit 10 and detects the temperature of the delay unit 10, and converts the detected temperature to a digital value, temperature[3:0], and outputs the temperature[3:0] which indicates the temperature of the delay unit 10. For the sake of convenience, the temperature detection unit 460 and the delay unit 10 are illustrated spaced apart from each other in FIG. 17, however, practically, the temperature detection unit 460 is provided in proximity to the delay unit 10 so as to be able to detect the temperature of the delay unit 10.

Next, the discount control unit 450 (see FIG. 17) that is connected to the error detection unit 240 of the signal delay circuit 300 is described.

A signal indicating a fluctuation of the temperature as an external factor of the semiconductor apparatus is inputted to the discount control unit 450 (see FIG. 17) which is connected to the error detection unit 240 of the signal delay circuit 300 in Embodiment 4.

Here, a fluctuation of the temperature and a variation in the clock (clock_out) phase have a correlation with each other. For example, when a fluctuation of the temperature increases from a range of 30 to 50° C. to a range of 20 to 60° C., a variation in the clock (clock_out) phase becomes larger accordingly.

Such a fluctuation of the temperature is detected by the temperature detection unit 460 which is connected to the discount control unit 450.

The discount control unit 450 generates a discount signal discount[3:0] based on a temperature signal temperature_range[2:0] which is inputted from the temperature detection unit 460. The temperature signal temperature_range[2:0] which is inputted from the temperature detection unit 460 indicates a fluctuation of the temperature.

When a fluctuation of the temperature detected by the temperature detection unit 460 increases in the absolute value, the discount control unit 450 increases the discount number indicated by the discount signal discount[3:0] accordingly.

Similarly, when a fluctuation of the temperature detected by the temperature detection unit 460 decreases in the absolute value, the discount control unit 450 decreases the discount number indicated by the discount signal discount[3:0] accordingly.

Next, the internal configuration of the discount control unit 450 is described with reference to FIG. 18.

FIG. 18 is a diagram illustrating the discount control unit 450 connected to the signal delay circuit 400 included in the semiconductor apparatus in Embodiment 4.

The discount control unit 450 includes a storage unit 451, a comparison unit 452, and a control unit 453. The discount control unit 450 generates a discount signal discount[3:0] based on the temperature signal temperature_range[2:0].

The storage unit 451 stores a value, as the storage data, which is used by the comparison unit 452 for comparison of the temperature signal temperature_range[2:0]. When an update signal (update) is inputted from the control unit 453, the storage data is set by introducing the value of the temperature signal temperature_range[2:0]. As the storage unit 451, for example, a register or a memory may be used.

The comparison unit 452 compares the temperature signal temperature_range[2:0] inputted from the temperature detection unit 460 with the storage data stored by the storage unit 451, and outputs a comparison result signal indicating a result of the comparison to the control unit 453.

The control unit 453 performs an update process on the discount signal discount[3:0] based on the comparison result signal inputted from the comparison unit 452. The control unit 453 performs an update process on the discount signal discount[3:0], while outputting a set signal (set), a clear signal (clear), and an update signal (update). The update process of the discount signal discount[3:0], respective timings when the set signal (set) and the clear signal (clear) are outputted are described later.

Next, a correspondence between the 3-bit temperature signal temperature_range[2:0] and the 4-bit discount signal discount[3:0] is described with reference to FIGS. 19A and 19B.

Figure 19A:
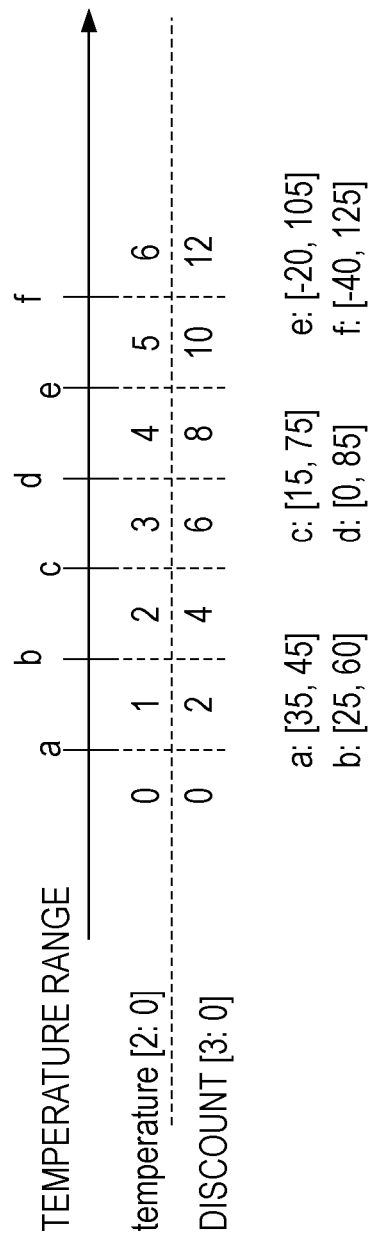
FIGS. 19A and 19B are tables each illustrating a correspondence between the value of an input signal and the value of an output signal of the discount control unit of the signal delay circuit in Embodiment 4.
Figure 19B:
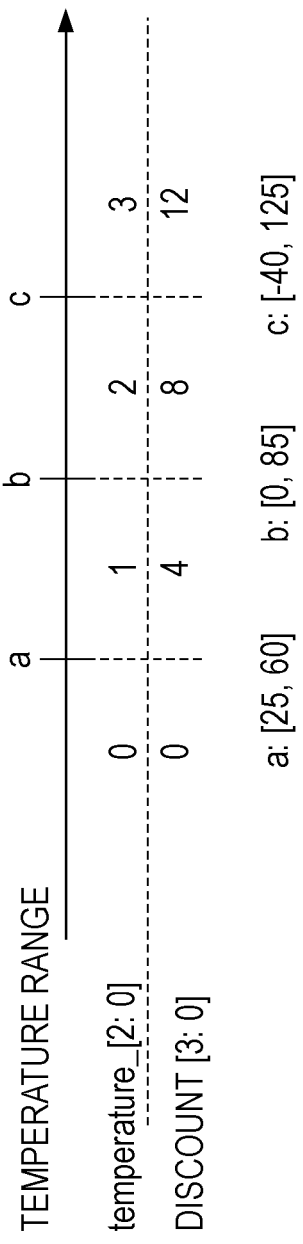

FIGS. 19A and 19B are tables each illustrating a correspondence between the value of an input signal (temperature signal temperature_range[2:0]) and the value of an output signal (discount signal discount[3:0]) of the discount control unit 450 of the signal delay circuit 400 in Embodiment 4.

FIGS. 19A and 19B include two types of correspondences: the correspondence illustrated in FIG. 19A, and the correspondence illustrated in FIG. 19B.

The discount control unit 450 generates a 4-bit discount signal discount[3:0] as the correspondence illustrated in FIG. 19A or 19B based on a 3-bit temperature signal temperature_range[2:0]. First, the correspondence illustrated in FIG. 19A is described.

FIG. 19A illustrates a conversion table with seven columns for respective regions obtained when the fluctuation range of temperature is separated by six boundaries of a boundary "a" to a boundary "f". Here, a range of temperature is denoted by [lower limit, upper limit] expressed in terms of the lower limit and the upper limit of the range.

The boundary "a" denotes a temperature range of [35, 45] (the range from the lower limit of 35° C. to the upper limit of 45° C.). The left side of the boundary "a" indicates the region including any range for which the lower limit of the fluctuation range of temperature is greater than or equal to 35° C., and the upper limit of the fluctuation range is less than 45° C.

The boundary "b" denotes a temperature range of [25, 60] (the range from the lower limit of 25° C. to the upper limit of 60° C.). The region on the right of the boundary "a" and on the left of the boundary "b" indicates a region including any range for which the lower limit of the fluctuation range is greater than or equal to 25° C., and the upper limit of the fluctuation range is less than 60° C.

The boundary "c" denotes a temperature range of [15, 75] (the range from the lower limit of 15° C. to the upper limit of 75° C.). The region on the right of the boundary "b" and on the left of the boundary "c" indicates a region including any range for which the lower limit of the fluctuation range is greater than or equal to 15° C., and the upper limit of the fluctuation range is less than 75° C.

The boundary "d" denotes a temperature range of [0, 85] (the range from the lower limit of 0° C. to the upper limit of 85° C.). The region on the right of the boundary "c" and on the left of the boundary "d" indicates a region including any range for which the lower limit of the fluctuation range is greater than or equal to 0° C., and the upper limit of the fluctuation range is less than 85° C.

The boundary "e" denotes a temperature range of [−20, 105] (the range from the lower limit of −20° C. to the upper limit of 105° C.). The region on the right of the boundary "d" and on the left of the boundary "e" indicates a region including any range for which the lower limit of the fluctuation range is greater than or equal to −20° C., and the upper limit of the fluctuation range is less than 105° C.

The boundary "f" denotes a temperature range of [−40, 125] (the range from the lower limit of −40° C. to the upper limit of 125° C.). The region on the right of the boundary "e" and on the left of the boundary "f" indicates a region including any range for which the lower limit of the fluctuation range is greater than or equal to −40° C., and the upper limit of the fluctuation range is less than 125° C.

The right side of the boundary "f" indicates the region including any range for which the lower limit of the fluctuation range is greater than or equal to −40° C., and the upper limit of the fluctuation range is less than 125° C.

In this manner, the fluctuation range of temperature tends to expand as the range is moved to the right in the horizontal direction (from the boundary "a" to the boundary "f"), and the fluctuation range of temperature tends to reduce from the boundary "f" to the boundary "a."

The region to which a fluctuation range of temperature belongs may be determined by identifying either one of the boundaries ("a" to "f") such that the upper and lower limits of the fluctuation range exceeds and falls below the respective upper and lower limits of the identified boundary. However, herein, the region to which a fluctuation range of temperature belongs is determined by identifying either one of the boundaries ("a" to "f") such that either upper or lower limit of the fluctuation range exceeds or falls below the respective upper or lower limit of the identified boundary.

As illustrated in FIG. 19A, the 3-bit temperature signal temperature_range[2:0] is assigned with "0" for the region on the left of the boundary "a", is assigned with "5" for the region on the right of the boundary "e" and on the left of the boundary "f" (the boundary "e" is included), and is assigned with "6" for the region on the right of the boundary "f" (the boundary "f" is included).

On the other hand, the 4-bit discount signal discount[3:0] is assigned with "0" for the region on the left of the boundary "a", is assigned with "10" for the region on the right of the boundary "e" and on the left of the boundary "f" (the boundary "e" is included), and is assigned with "12" for the region on the right of the boundary "f" (the boundary "f" is included).

For example, when the fluctuation range of temperature is from 30 to 50° C., the fluctuation range belongs to the region between the boundary "a" and the boundary "b", and thus the 3-bit temperature signal temperature_range[2:0] indicates "1", and accordingly, a 4-bit discount signal discount[3:0] indicating "2" is generated.

FIG. 19B illustrates a conversion table with four columns for respective regions obtained when the fluctuation range of temperature is separated by three boundaries of the boundary "a" to the boundary "c." Here, a range of temperature is denoted by [lower limit, upper limit] expressed in terms of the lower limit and the upper limit of the range.

The boundary "a" denotes a temperature range of [25, 60] (the range from the lower limit of 25° C. to the upper limit of 60° C.). The left side of the boundary "a" indicates the region including any range for which the lower limit of the fluctuation range of temperature is greater than or equal to 25° C., and the upper limit of the fluctuation range is less than 60° C.

The boundary "b" denotes a temperature range of [0, 85] (the range from the lower limit of 0° C. to the upper limit of 85° C.). The region on the right of the boundary "a" and on the left of the boundary "b" indicates a region including any range for which the lower limit of the fluctuation range is greater than or equal to 0° C., and the upper limit of the fluctuation range is less than 85° C.

The boundary "c" denotes a temperature range of [−40, 125] (the range from the lower limit of −40° C. to the upper limit of 125° C.). The region on the right of the boundary "b" and on the left of the boundary "c" indicates a region including any range for which the lower limit of the fluctuation range is greater than or equal to −40° C., and the upper limit of the fluctuation range is less than 125° C.

The region on the right of the boundary "c" indicates a region including any range for which the lower limit of the fluctuation range is less than −40° C., and the upper limit of the fluctuation range is greater than or equal to 125° C.

In this manner, the fluctuation range of temperature tends to expand as the range is moved from the boundary "a" to the boundary "c", and the fluctuation range of temperature tends to reduce from the boundary "c" to the boundary "a."

The region to which a fluctuation range of temperature belongs may be determined by identifying either one of the boundaries ("a" to "c") such that the upper and lower limits of the fluctuation range exceeds and falls below the respective upper and lower limits of the identified boundary. However, herein, the region to which a fluctuation range of temperature belongs is determined by identifying either one of the boundaries ("a" to "c") such that either upper or lower limit of the fluctuation range exceeds or falls below the respective upper or lower limit of the identified boundary.

As illustrated in FIG. 19B, the 3-bit temperature signal temperature_range[2:0] is assigned with "0" for the region on the left of the boundary "a", is assigned with "2" for the region on the right of the boundary "b" and on the left of the boundary "c" (the boundary "b" is included), and is assigned with "3" for the region on the right of the boundary "c" (the boundary "c" is included).

On the other hand, the 4-bit discount signal discount[3:0] is assigned with "0" for the region on the left of the boundary "a", is assigned with "8" for the region on the right of the boundary "b" and on the left of the boundary "c" (the boundary "b" is included), and is assigned with "12" for the region on the right of the boundary "c" (the boundary "c" is included).

The discount control unit 450 uses the conversion table illustrated in FIG. 19A or 19B to generate a 4-bit discount signal discount[3:0] based on a 3-bit temperature signal temperature_range [2:0].

Next, the operation of the signal delay circuit 400 in Embodiment 4 is described with reference to FIGS. 20A and 20B.

Figure 20A:
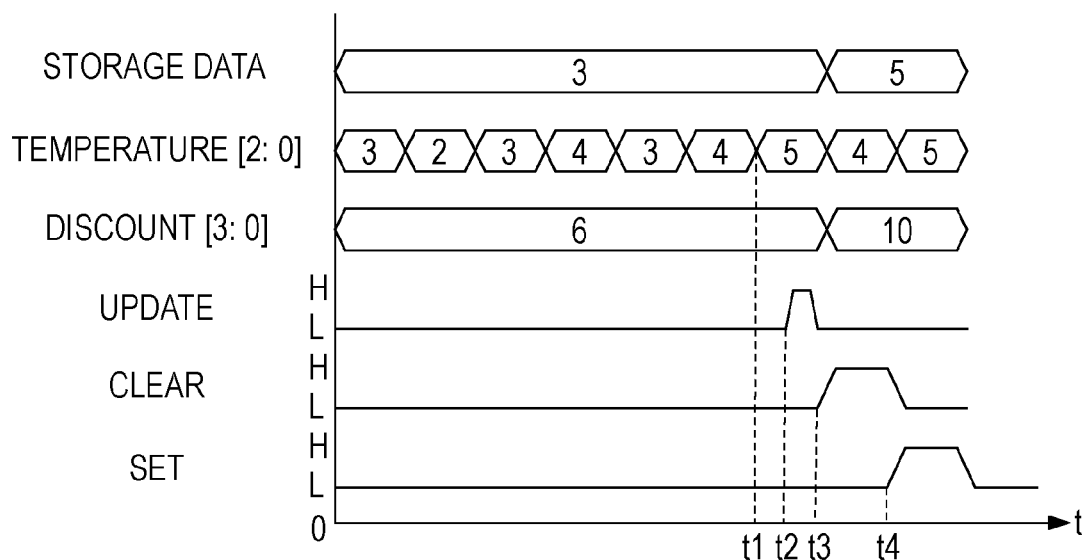
FIGS. 20A and 20B are timing charts each illustrating an operation of the signal delay circuit in Embodiment 4.
Figure 20B:
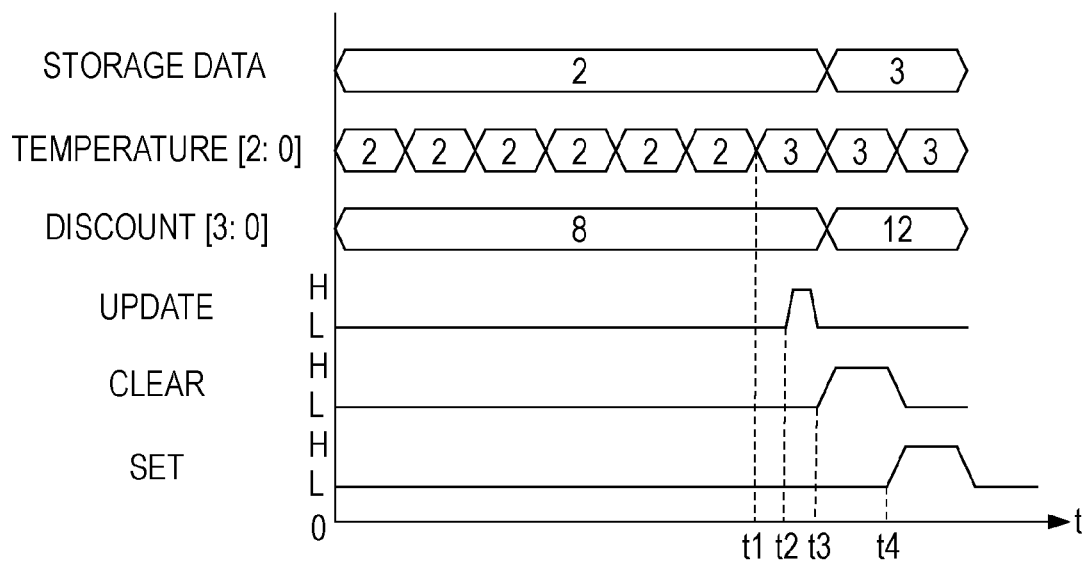

FIGS. 20A and 20B are timing charts each illustrating the operation of the signal delay circuit 400 in Embodiment 4. FIG. 20A illustrates the operation when the conversion table illustrated in FIG. 19A is used, and FIG. 20B illustrates the operation when the conversion table illustrated in FIG. 19B is used.

FIG. 20A illustrates the storage data stored by the storage unit 451, the temperature signal temperature_range[2:0], the discount signal discount[3:0], the update signal (update), the clear signal (clear), and the set signal (set) that are outputted by the temperature detection unit 460. In FIG. 20A, the horizontal axis is the time axis.

In the exemplary operation illustrated in FIG. 20A, it is assumed that when the code difference between the storage data and the temperature signal temperature_range[2:0] (hereinafter referred to as a current temperature signal temperature_range[2:0]) outputted by the temperature detection unit 460 becomes "2" or greater, update data is updated.

It is assumed that the fluctuation range of temperature is 10 to 80° C. at t=0, and thus the temperature signal temperature_range[2:0] stored as the storage data is "3" because the fluctuation range belongs to the region between the boundary "c" and the boundary "d." It is also assumed that the temperature signal temperature_range[2:0] which is outputted by the temperature detection unit 460 is "3."

At this point, the discount signal discount[3:0] is "3" as seen from the conversion table of FIG. 19A. It is also assumed that an update signal (update), the clear signal (clear), and the set signal (set) are all at L (Low) level.

As the time elapses, a fluctuation of the temperature occurs, and the value of the current temperature signal temperature_range[2:0] changes from "3" at t=0, to "2", "3", "4", "3", "4", and "5" at time t1.

At the time t1, the code difference between the storage data of "3" and the current temperature signal temperature_range[2:0] of "5" becomes "2" or greater for the first time.

Thus, the update signal (update) is set to H (High) level at time t2, and, accordingly the update data is updated to "5."

When the clear signal (clear) is set to H level at time t3, the count value of the counting unit 242 (see FIG. 11) is cleared.

Further, when the set signal (set) is set to H level at time t4, the discount signal discount[3:0] of the determination unit 243 (see FIG. 11) is set to "10."

The operation illustrated in FIG. 20A corresponds to the event, for example, that the fluctuation of the temperature changes from 10 to 80° C. at time t=0, to −30 to 115° C. at time t4.

By changing the discount signal discount[3:0] in accordance with the fluctuation of the temperature in the above manner, the signal delay circuit 400 in Embodiment 4 may avoid erroneous detection, and may secure smooth and stable operation.

Next, the exemplary operation in FIG. 20B is described.

Similarly to FIG. 20A, FIG. 20B illustrates the storage data stored by the storage unit 451, the current temperature signal temperature_range[2:0], the discount signal discount[3:0], the update signal (update), the clear signal (clear), and the set signal (set). In FIG. 20B, the horizontal axis is the time axis.

In the exemplary operation illustrated in FIG. 20B, it is assumed that when the code difference between the storage data and the current temperature signal temperature_range[2:0] becomes "1" or greater, update data is updated.

It is assumed that the fluctuation of the temperature is −20 to 100° C. at t=0, and the temperature signal temperature_range[2:0] stored as the storage data is "2." It is also assumed that the temperature signal temperature_range[2:0] which is outputted by the temperature detection unit 460 is "2."

At this point, the discount signal discount[3:0] is "8" as seen from the conversion table of FIG. 19B. It is also assumed that the update signal (update), the clear signal (clear), and the set signal (set) are all at L (Low) level.

As the time elapses, a fluctuation of the temperature occurs, and the value of the current temperature signal temperature_range[2:0] changes from "2" at t=0, to "3" at time t1, while being maintained at "2" between 0 and t1.

At the time t1, the code difference between the storage data of "2" and the current temperature signal temperature_range[2:0] of "3" becomes "1" or greater for the first time.

Thus, the update signal (update) is set to H (High) level at time t2, and, accordingly the update data is updated to "3."

When the clear signal (clear) is set to H level at time t3, the count value of the counting unit 242 (see FIG. 11) is cleared.

In addition, when the set signal (set) is set to H level at time t4, the discount signal discount[3:0] of the determination unit 243 (see FIG. 11) is set to "12."

The operation illustrated in FIG. 20B corresponds to the event, for example, that the fluctuation of the temperature changes from −20 to 100° C. at time t=0, to −50 to 130° C. at time t4.

By changing the discount signal discount[3:0] which is held by the determination unit 243 in the error detection unit 240 in accordance with the fluctuation of the temperature as described above, the signal delay circuit 400 in Embodiment 4 may avoid erroneous detection in accordance with the fluctuation of the temperature, and may secure smooth and stable operation.

As described above, according to the signal delay circuit 400 included in the semiconductor apparatus in Embodiment 4, when the clock phase varies due to the fluctuation of the temperature, which is an example of an external factor, and consequently a phase out of the acceptable range is detected, the count number is discounted in accordance with the fluctuation range of the temperature.

Therefore, erroneous detection may be avoided, and thus smooth and stable operation of the entire semiconductor apparatus including the signal delay circuit 400 in Embodiment 4 may be secured.

In addition, the discount number is changed in accordance with the fluctuation of the temperature, and the count number is discounted in accordance with an external factor while securing the responsiveness of the signal delay circuit 400, and thus smooth and stable operation of the signal delay circuit 400 and the semiconductor apparatus including the signal delay circuit 400 may be secured in accordance with an external factor.

Additionally, the signal delay circuit 400 in Embodiment 4 does not include a plurality of variable delay circuits, majority circuits, and number of majority decision setting registers unlike a conventional semiconductor circuit apparatus, and thus the signal delay circuit 400 is not increased in size, and may be miniaturized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor apparatus comprising:
a delay circuit to apply delay to an input signal;
a phase detector to detect a phase of an output signal which is outputted from the delay circuit;

a filter to set a range of the phase of the output signal for stable operation based on phase information outputted from the phase detector;

a counter to count a number of detections of the output signal when the phase deviates from the range for stable operation;

a discount controller to generate a discount signal indicating a discount number for the number counted by the counter, in accordance with an operating condition or an external factor outside the delay circuit; and an error detector to determine whether or not an error of the phase of the output signal has occurred based on the number counted by the counter and a discount number indicated by the discount signal.

2. The semiconductor apparatus according to claim 1, wherein the discount controller increases the discount number as a degree of fluctuation of the operating condition or the external factor increases.

3. The semiconductor apparatus according to claim 1, wherein the operating condition is a fluctuation range of a power supply voltage of the delay circuit, and the discount controller is to increase the discount number as the fluctuation range of the power supply voltage increases.

4. The semiconductor apparatus according to claim 1, wherein the external factor is a fluctuation of the power supply voltage of the semiconductor apparatus, the semiconductor apparatus further comprises a power supply voltage detection unit to detect the fluctuation of the power supply voltage, and the discount controller is to increase the discount number as the fluctuation of the power supply voltage detected by the power supply voltage detection unit increases, and to decrease the discount number as the fluctuation of the power supply voltage detected by the power supply voltage detection unit decreases.

5. The semiconductor apparatus according to claim 1, wherein the operating condition is a fluctuation range of a temperature of the semiconductor apparatus, and the discount controller is to increase the discount number as the fluctuation range of the temperature increases.

6. The semiconductor apparatus according to claim 1, wherein the external factor is a variation in a fluctuation range of a temperature of the semiconductor apparatus, the semiconductor apparatus further comprises a temperature detection unit to detect the variation in the fluctuation range of the temperature of the semiconductor apparatus, and the discount controller is to increase the discount number as the fluctuation range of the temperature detected by the temperature detection unit increases and to decrease the discount number as the fluctuation range of the temperature detected by the temperature detection unit decreases.

7. An information processing apparatus comprising:

a memory controller including a delay circuit to apply delay to an input signal, a phase detector to detect a phase of an output signal which is outputted from the delay circuit, a filter to set a range of the phase of the output signal for stable operation based on phase information outputted from the phase detector, a counter to count a number of detections of the output signal when the phase deviates from the range for stable operation, a discount controller to generate a discount signal indicating a discount number for the number counted by the counter, in accordance with an operating condition or an external factor of the delay circuit, and an error detector to determine whether or not an error of the phase of the output signal has occurred based on the number counted by the counter and a discount number indicated by the discount signal;

a processing unit; and a main storage unit, wherein the memory controller performs data transfer between the processing unit and the main storage unit.

* * * * *